(12) United States Patent
Lan et al.

(10) Patent No.: US 11,336,251 B2
(45) Date of Patent: May 17, 2022

(54) DEVICE WITH 3D INDUCTOR AND MAGNETIC CORE IN SUBSTRATE

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 34 days.

(21) Appl. No.: 16/986,595

(22) Filed: Aug. 6, 2020

(65) Prior Publication Data

US 2021/0099149 A1 Apr. 1, 2021

Related U.S. Application Data

(60) Provisional application No. 62/908,450, filed on Sep. 30, 2019.

(51) Int. Cl.
| | |
|---|---|
| *H03H 7/01* | (2006.01) |
| *H03H 3/08* | (2006.01) |
| *H03H 7/46* | (2006.01) |
| *H01F 3/00* | (2006.01) |
| *H01L 23/64* | (2006.01) |
| *H01L 23/66* | (2006.01) |
| *H01L 23/538* | (2006.01) |

(52) U.S. Cl.
CPC ............ *H03H 7/0115* (2013.01); *H01F 3/00* (2013.01); *H01L 23/5384* (2013.01); *H01L 23/642* (2013.01); *H01L 23/645* (2013.01); *H01L 23/66* (2013.01); *H03H 3/08* (2013.01); *H03H 7/0138* (2013.01); *H03H 7/1741* (2013.01); *H03H 7/463* (2013.01)

(58) Field of Classification Search
CPC .......... H03H 3/08; H03H 7/0115; H03H 3/02; H03H 7/42; H01L 23/645
USPC ....................................................... 333/185
See application file for complete search history.

(56) References Cited

U.S. PATENT DOCUMENTS

| | | | | |
|---|---|---|---|---|
| 2008/0151518 | A1* | 6/2008 | Hsu | H01L 24/24 361/762 |
| 2017/0140862 | A1* | 5/2017 | Yun | H01F 27/2804 |
| 2017/0338034 | A1* | 11/2017 | Yun | H01F 17/00 |
| 2019/0239358 | A1* | 8/2019 | Bartley | G02B 6/46 |

\* cited by examiner

*Primary Examiner* — Rakesh B Patel

(74) *Attorney, Agent, or Firm* — Muncy, Geissler, Olds & Lowe P.C.

(57) ABSTRACT

Disclosed are devices and methods for fabricating devices. A device can include a passive portion having at least one metal insulator metal (MIM) capacitor and at least one 2-dimensional (2D) inductor. The device further includes a substrate and the passive portion is formed on the substrate. A magnetic core is embedded in the substrate. A 3-dimensional (3D) inductor is also included having windings formed at least in part in the substrate and at least a portion of the windings being formed around the magnetic core.

29 Claims, 15 Drawing Sheets

DEVICE WITH 3D INDUCTOR AND MAGNETIC CORE IN SUBSTRATE

CROSS-REFERENCE TO RELATED APPLICATIONS

The present application for patent claims the benefit of Provisional Patent Application No. 62/908,450 entitled "DEVICE WITH 3D INDUCTOR AND MAGNETIC CORE IN SUBSTRATE" filed Sep. 30, 2019, and assigned to the assignee hereof and hereby expressly incorporated herein by reference in its entirety.

FIELD OF DISCLOSURE

This disclosure relates generally to devices, such as integrated passive devices (IPD) formed on a substrate, and more specifically, but not exclusively, to a device with a three dimensional (3D) inductor having a magnetic core embedded in the substrate.

BACKGROUND

Integrated circuit technology has achieved great strides in advancing computing power through miniaturization of active components. Integrated passive components have also been miniaturized. As frequencies and data rates get higher, there is a need for further miniaturization of integrated passive components, for example, filters which include inductive (L) and capacitive (C) elements in integrated circuit device. Additionally, to improve quality of received signals, certain components of a mobile device may be formed on an insulating substrate (e.g., glass substrate). For example, a circuit component may be formed on a glass substrate to "isolate" the component in order to reduce effects of noise from other components of the mobile device.

Radio-frequency (RF) filters may include integrated passive devices (IPD), such as a passive-on-glass (POG) device (e.g., a capacitor and/or an inductor). Glass may be desirable for its low loss tangent and is a preferred substrate material for example when used for RF IPD, acoustic resonators/filters and RF MEMS switches. Wideband filters are critical for new radio designs, e.g., 5G RF frontend circuits, to offer higher speed communication. Among the available RF filter technologies, integrated passive devices (including metal insulator metal (MIM) capacitors and inductors) can achieve high quality (HQ) for both L and C devices. Other RF filter technologies include acoustic filters, such as surface acoustic wave (SAW) filter, bulk acoustic wave (BAW) filter, film bulk acoustic resonator (FBAR)). HQ IPD are desirable for high performance RF Frontend (RFFE) applications to not only for matching components but also for LC filters, that require low insertion loss in wideband applications (e.g., for 5G wideband filter application). POG and its application to RF wideband filters has been demonstrated in the art. However, there is a need for improved filter performance along with reducing the filter size.

Accordingly, there is a need for systems, apparatus, and methods that improve on the conventional approaches including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the No errors found detailed description presented below.

At least one aspect includes a device including a passive portion having at least one metal insulator metal (MIM) capacitor and at least one 2-dimensional (2D) inductor. The device further includes a substrate and the passive portion is formed on the substrate. A magnetic core is embedded in the substrate. A 3-dimensional (3D) inductor is also included having windings formed at least in part in the substrate and at least a portion of the windings being formed around the magnetic core.

At least one additional aspect includes a method for manufacturing a device. The method includes embedding a magnetic core a substrate. A passive portion is formed on the substrate, wherein the passive portion has at least one metal insulator metal (MIM) capacitor and at least one 2-dimensional (2D) inductor. A 3-dimensional (3D) inductor is formed having windings formed at least in part in the substrate and at least a portion of the windings being formed around the magnetic core.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
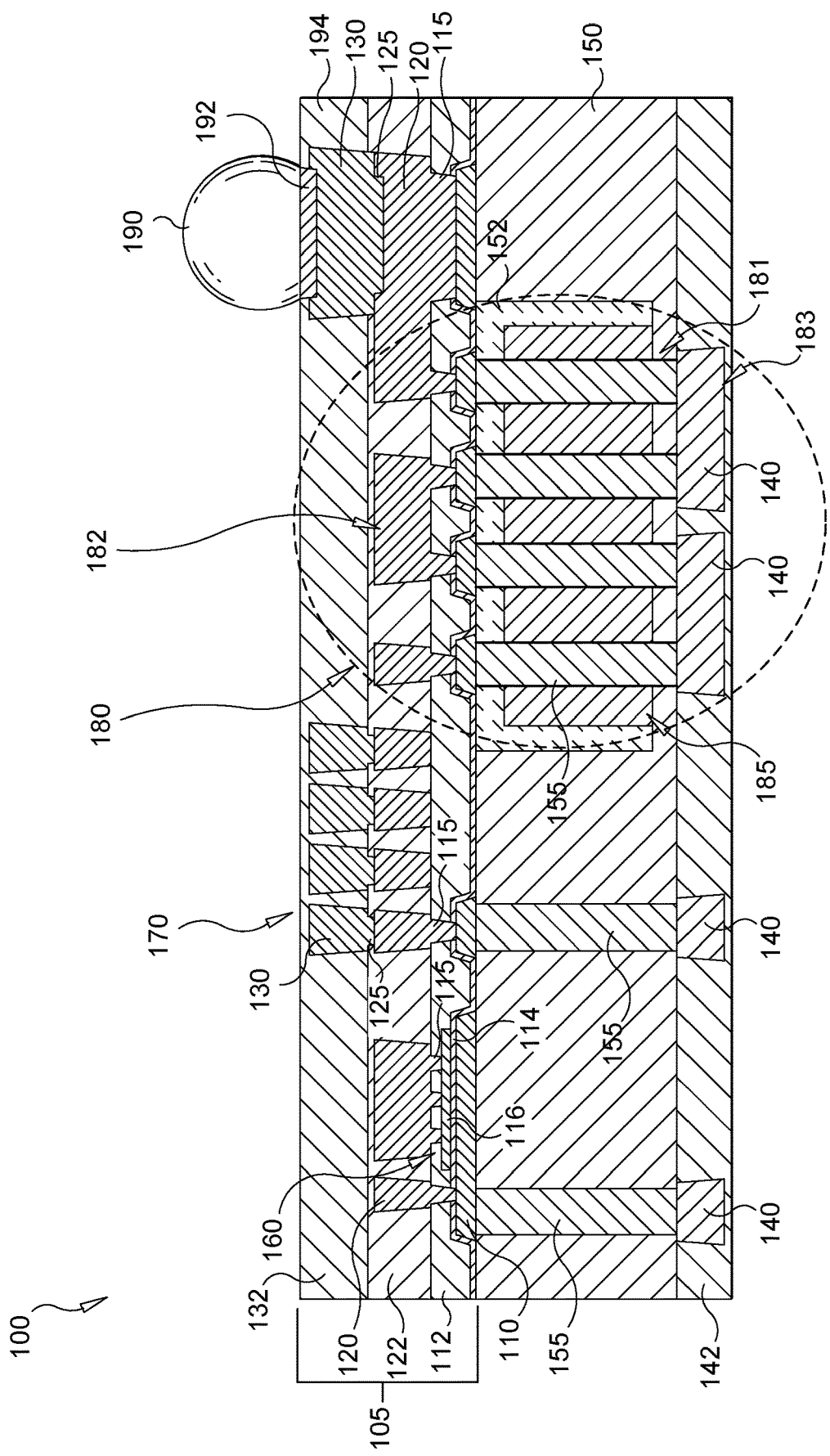
FIG. 1 illustrates a partial side view of a semiconductor device with a ceramic substrate in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Recently, a new series of thin alumina ceramic ribbon substrate has been introduced which not only has lower loss tangent ($1e^{-4}$, one order smaller than glass of $1e^{-3}$), but also offers 30× higher thermal conductivity (~36 W/Ko-m) better than glass substrate. Thus, the alumina ceramic material, with lower loss tangent and higher thermal conductivity along with higher coefficient of thermal expansion (CTE) vs glass. The alumina ceramic substrate can be used as an alternative substrate for RF IPD, acoustic resonators/filters and RF MEMS switches. Additionally, it may be used for silicon CMOS devices for layer transfer to form RF silicon-on-insulator (SOI).

As noted above, there is a need for improved filter performance along with reduced filter size. The conventional POG has a thick glass substrate (e.g., 700 um), whereas the alumina ceramic substrate discussed herein is a thin substrate (e.g., ~40-80 um), which aids in reducing the filter size. Additionally, the high thermal conductivity and low loss tangent of the alumina ceramic substrate is preferred for RF filter devices use high power handling (e.g., filters in the TX path). Even though improved performance can be expected for the 2D IPD filters on an alumina ceramic substrate under TX high power handling, a smaller compact filter device is desirable for mobile UE devices. This can be obtained by forming a 3D solenoid inductor with through-substrate via and metal fill. However, for the traditional 3D inductor (e.g., 3D solenoid inductor), a high density inductor cannot be formed using the substrate itself, because the permeability is unity, which is the same as for the 2D planar inductor. Thus, various aspects disclosed herein overcome this limitation by forming a magnetic core which has a higher permeability than the substrate for the 3D inductor.

FIG. 1 illustrates a partial side view of a passive device in accordance with some examples of the disclosure. As shown in FIG. 1, a semiconductor device 100 can include a passive portion 105 formed on a substrate 150 (such as an alumina ceramic substrate, which will be used herein in some examples for illustration). The passive portion 105 may be formed as a multilayer component including a first metal layer 110 (M1 110) applied on the alumina substrate 150. As illustrated, the passive portion 105 includes a plurality of metal layers, such as a second metal layer 120 (M2 120), and a third metal layer 130 (M3 130), in addition to metal layer M1 110. It will be appreciated that illustrated aspects are used solely to provide an example and not to limit the various aspects disclosed. For example, the passive portion may include more or less metal layers than illustrated. One or more through-substrate vias (e.g., via 115 and via 125), may be through-passivation vias, in one example, and are used to electrically couple the metal layers. For example, M1 110 can be coupled to M2 120 by vias 115 and M2 120 can be coupled to M3 130 by vias 125 through the passivation layers (e.g., 112 and 122). Additionally passive portion 105 may also include a plurality of passivation/insulating layers, including a first inter-layer dielectric (ILD) 112, a second ILD 122 and a third ILD 132. A dielectric material of the first ILD 112, the second ILD 122 and/or third ILD 132 may include polyimide (PI), benzocyclobuten (BCB), polybenzoxazole (PBO), an acrylic, an epoxy, and/or other materials, as illustrative, non-limiting examples. In some implementations, the first ILD 112, the second ILD 122 and or third ILD 132 may be different materials. In other implementations, the first ILD 112, the second ILD 122 and/or the third ILD 132 may be the same material. As discussed above, one or more through-substrate vias, may be through-passivation vias (e.g., through-ILD), in one example, and used to electrically couple between the metal layers, as discussed above.

A MIM capacitor 160 may be formed in the passive portion 105 and comprises a portion of the first metal layer 110 (used as a bottom metal layer for the MIM capacitor 160), an insulating layer 114 and top metal layer 116 (TM 116) coupled to the second metal layer 120 by vias 115. It will be appreciated that in some aspects to form on or more MIM capacitors 160 with good dielectric properties, like high capacitance density, low leakage current and high breakdown voltage, the dielectric insulator may be deposited or anodized separately from the interlayer dielectrics (e.g., silicon oxide (SiOx), silicon nitride (SiNx) by plasma-enhanced chemical vapor deposition (PECVD) and tantalum pentoxide ($Ta_2O_5$) by anadization of Ta metal). In some aspects, the insulating layer 114 may be a silicon nitride (SiN) compound, silicon oxide ($SiO_2$) compound, aluminum oxide ($Al_2O_3$), tantalum pentoxide ($Ta_2O_5$), zirconium dioxide ($ZrO_2$) or any other suitable insulating/dielectric material. In some aspects, interconnection between the various layers using vias (e.g., vias 115 and/or vias 125) and one or more metal layers (e.g., M1 110, M2 120 and/or M3 130) may be used to couple to the MIM capacitor 160, 2D inductor 170, 3D inductor 180 and/or external devices. For example, an external device can be coupled to the various components (e.g., MIM capacitor 160, 2D inductor 170, 3D inductor 180, etc.) using one or more external connectors (e.g., ball 190) through under bump metallization (UBM) 192 coupled to M3 130, via 125, M2 120, via 115 and/or M1 110. The external connectors (e.g., wafer-level package (WLP) ball, solder balls, solder bumps, copper pillar bumps, or other external connectors) are illustrated as a ball 190. Additionally, the various metal layers and vias may be used to connect the MIM capacitor 160, 2D inductor 170 and/or 3D inductor 180 to each other and/or internal components of passive portion 105, such as other capacitors, inductors, etc. (not illustrated). It will be appreciated, that the two thick metal layers, M2 120 and M3 130, which in some examples may be on the order of 8 um to 16 um in thickness, may be used to form the 2D inductor 170. The 2D inductor 170 may be formed with its windings routed in one or more of the thick layers (M2 120 and/or M3 130) in a spiral configuration for improved inductor quality factor (Q factor) and RF performance. The MIM capacitor 160 may be formed in the passive portion 105. A 2D inductor 170 may also be formed using the metal layers M1 110 and M2 120 As noted above, the formation of MIM capacitors 160, 2D inductors 170 and other components in an in the passive portion 105 are known and therefore will not be further detailed herein.

The 3D inductor 180 may be formed using multiple winding portions. For example, a first portion of the windings 181 of the 3D inductor 180 may be formed in substrate 150 using through-substrate vias 155 (e.g., illustrated as a through alumina via (TAV) 155 in the alumina substrate 150). A second portion of the windings 182 of the 3D inductor 180 may be formed by connections in at least one metal layer (e.g., as illustrated in M1 110 and M2 120) in the passive portion 105. The second portion of the windings 182 may also be formed using additional metal layers such as M3 130 or other metal layers if available. The second portion of the windings 182 of the 3D inductor 180 may be cross coupled to vias 155 to form an angled pattern (such as illustrated in the top graphic) or may be coupled in a straight fashion to form concentric windings. A third portion of the windings 183 of the 3D inductor 180 may be formed by connections in at least one metal layer (e.g., bottom metal layer 140 (MA 140)) on a side of the substrate 150 opposite the passive portion 105. The metal layers (M1 110, M2 120, M3 130, MA 140, TM 116) may be formed from high conductivity materials such as copper (Cu), aluminum (Al), gold (Au), alloys or combinations thereof.

As illustrated, the bottom metal layer 140, may be formed on the alumina substrate 150 and enclosed in bottom insulating/passivation layer, such as bottom ILD 142. In addition to the bottom winding metal for the 3D inductor, MA 140 can also serve as an interconnect for the components (e.g., MIM capacitor 160, 2D inductor 170, etc.) that can benefit from having an interconnect from the bottom side of the substrate 150. The third portion of the windings 183, of the 3D inductor 180, may be formed by portions of MA 140. The third portion of the windings 183 may be cross coupled to vias 155 to form an angled pattern or may be coupled in a straight fashion to form concentric windings. Additionally, one of the second portion of the windings 182 or the third portion of the windings 183 may be angled and the other may be straight to form another winding configuration. It will be appreciated that the windings configurations for the 3D inductor 180 are not limited to any specific layout or configuration. For example, the MIM capacitor 160 can be formed from one or more metal layers of the multiple metal layers in the passive portion 105. As illustrated, at least a portion of the windings (e.g., 182) of the 3D inductor 180 is formed on at least one common metal layer (e.g., M1 110) with the MIM capacitor 160. Additionally or alternatively, the 2D inductor 170 may be formed on adjacent metal layers (M2 120 and M3 130) of the multiple metal layers (e.g., M1, M2, M3, etc.) of the passive portion 105. At least a portion of the windings (e.g., 182) of the 3D inductor 180 is formed on at least one common metal layer with the 2D inductor (e.g., M2 120). However, other configurations may not have any shared metal layers with the MIM capacitor 160 and/or 2D inductor 170 or the common metal layers may be used for connecting to another metal layer using vias, etc. Accordingly, it will be appreciated that the 3D inductors may be formed by through-substrate vias 155 (e.g., through-alumina via (TAV)) and various front-side and back-side processes. It will be appreciated that the illustrations and descriptions provided herein are solely to provide examples and are not intended to limit the various aspects disclosed herein.

Regardless of the winding configurations of the 3D inductor 180, the embedded magnetic core 185 can be used to provide a high-quality and high-density 3D inductor 180. In some example configurations, the magnetic core extends beyond the windings of the 3D inductor. The magnetic core may be formed from high magnetic permeability (high µ) metals such as at least one of iron (Fe), cobalt (Co) or nickel (Ni) and/or other ferrite materials. The magnetic core 185 may be embedded in the substrate 150 using a core filler 152 to secure the magnetic core. The core filler 152 may be glass or ceramic, such as a glass or ceramic frit or paste. The windings of the 3D inductor 180 are at least partially disposed around the magnetic core 185. In some configurations the windings of the 3D inductor 180 are entirely disposed around the magnetic core 185, which extends beyond the windings of the 3D inductor 180, as illustrated. However, in alternative examples at least a portion of the windings of the 3D inductor may extend beyond the magnetic core 185 and/or the magnetic core 185 may be contained within the windings of the 3D inductor so no portion of the magnet core 185 extends beyond the 3D inductor 180. Accordingly, it will be appreciated that the various illustrations and descriptions provided herein are solely to provide examples and are not intended to limit the various aspects disclosed herein.

Figure 2:
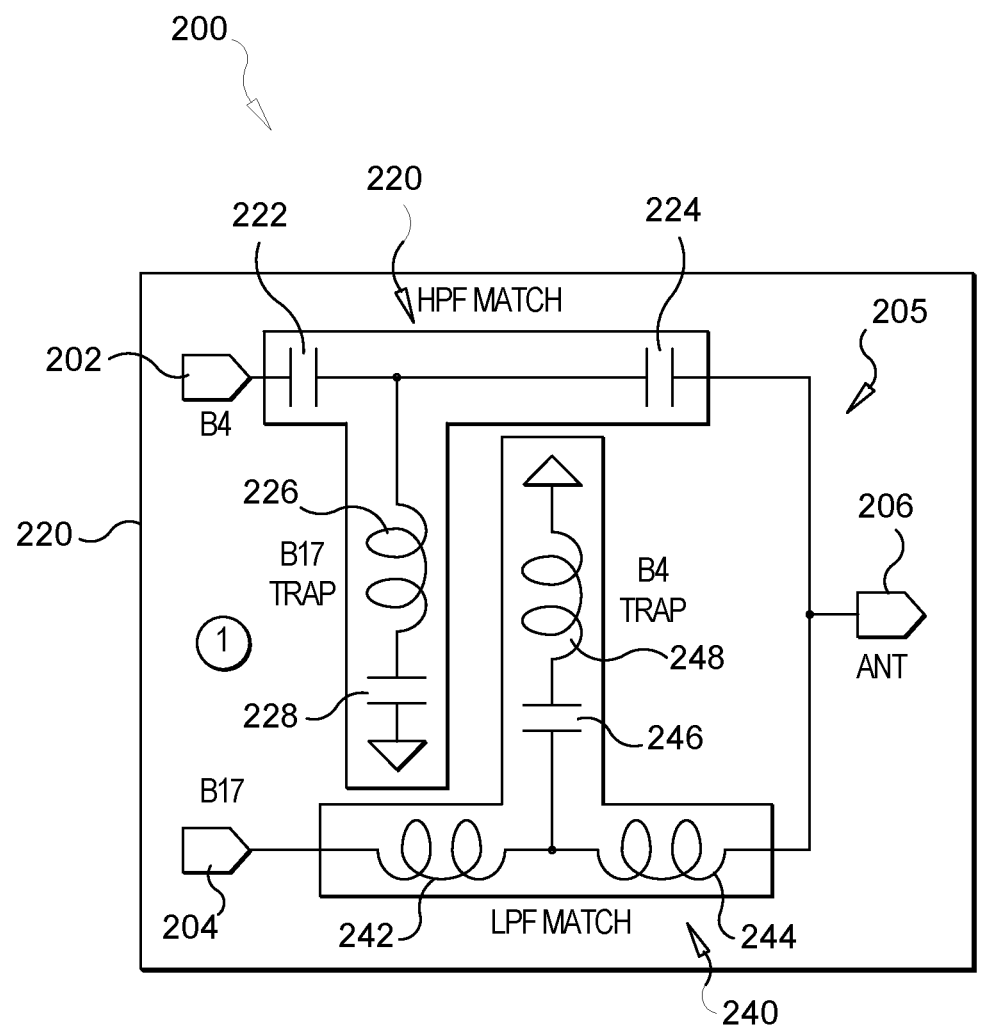
FIG. 2 illustrates a schematic diagram of a multiplexer in accordance with some examples of the disclosure.

FIG. 2 illustrates a schematic diagram of a multiplexer in accordance with some examples of the disclosure. In FIG. 2, the multiplexer 200 is illustrated as a diplexer 200, but it will be appreciated that the various aspects herein can be applied to many filter configurations including a bandpass filter, diplexer, triplexer, etc. The diplexer 200 includes a high band (HB) port 202, a low band (LB) port 204, and an antenna 206. A high band path 220 of the diplexer 200 includes a first capacitor 222 coupled to the HB port 202. A second capacitor 224 is coupled in series with the first capacitor 222. A first inductor 226 (B17) is coupled between capacitors 222 and 224. The first inductor 226 has a third capacitor 228 coupled to ground and in series with the first inductor 226. The first series coupled capacitor 224 is also coupled to the antenna 206. A low band path 240 of the diplexer 200 includes a second inductor 242 couple in series to the LB port 204 and in series with a third inductor 244. The low band path 240 also includes a fourth capacitor 246 coupled between the second inductor 242 and third inductor 244. The fourth capacitor 246 is also coupled to ground through a fourth inductor 248 (B4) which is in series with the fourth capacitor 246. The second inductor 242 is also coupled to antenna 206. In operation, as is known, the diplexer 200 will pass high frequency signals between the HB port 202 and the antenna 206. Likewise, the diplexer 200 will pass low frequency signals between the LB port 204 and the antenna 206. It will be appreciated, the schematic diagram illustrated (e.g., number, connections and/or positions of passive elements) may be modified as is common for various filter designs and manufacturing considerations. It will be appreciated the passive components (e.g., MIM capacitor 160, 2D inductor 170 and 2D inductor 180) may be used to form diplexer 200 or at least a portion of diplexer 200. Further, it will be appreciated that the schematic diagram of diplexer 200 is merely an example provided for explanation of the various aspects and is not intended to limit the aspects disclosed herein.

Figure 3:
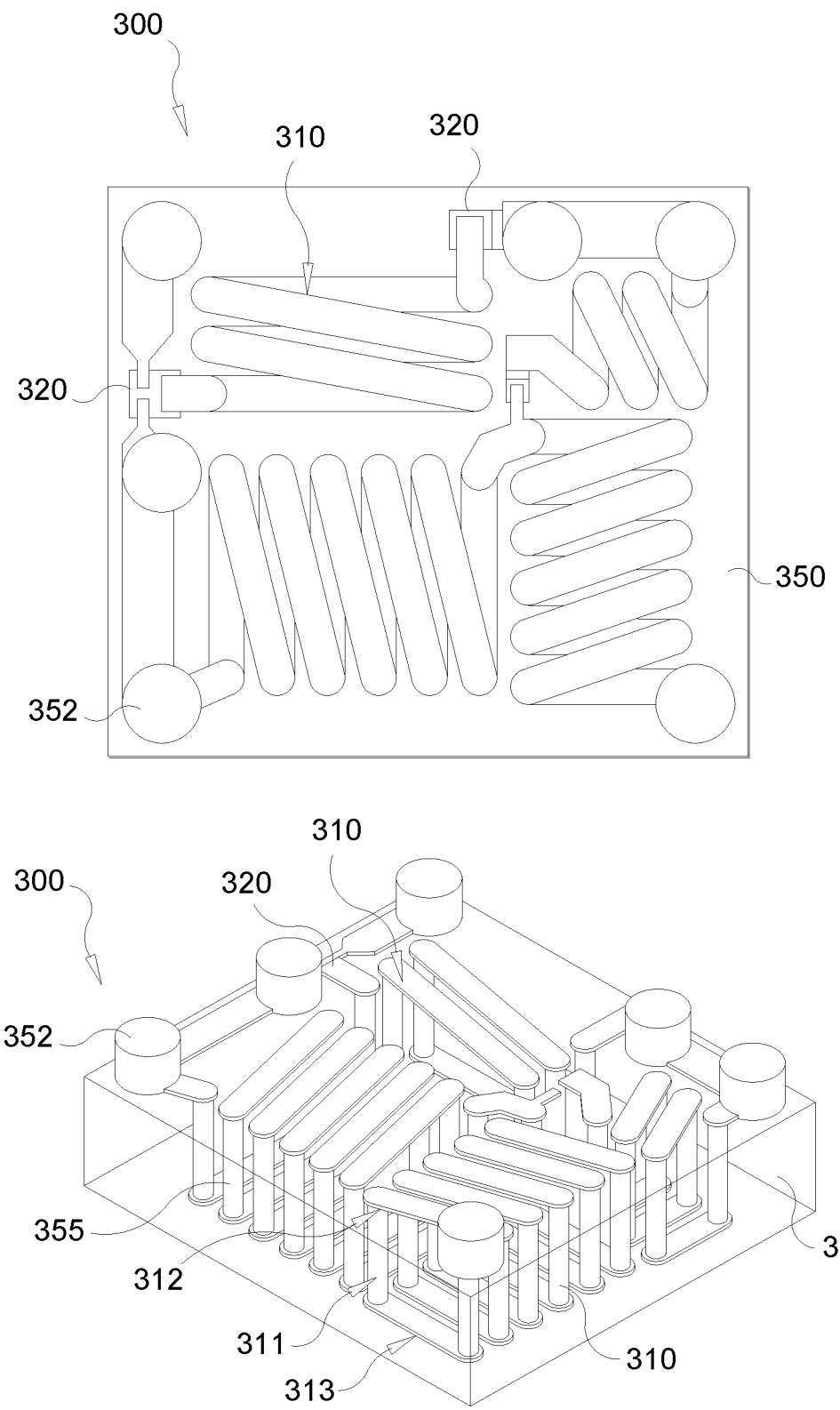
FIG. 3 illustrates a plan view and perspective view of a semiconductor device in accordance with some examples of the disclosure.

FIG. 3 illustrates a plan view and perspective view of a semiconductor device 300 in accordance with some examples of the disclosure. As shown in FIG. 3, the semiconductor device 300 includes several 3D inductors 310 and MIM capacitors 320 that could be used to for various devices, such as diplexer 200 illustrated in relation to FIG. 2. The MIM capacitors 320 may be formed on an alumina ceramic substrate 350 or other high performance substrate as discussed herein. It will be appreciated from the foregoing that the semiconductor device 300 may contain any of a number of components (e.g., MIM capacitors, 2D inductors, 3D inductors, etc.) that can benefit the various aspects disclosed herein. The semiconductor device 300 also includes external connectors 352, which may be realized in any form known in the art (e.g., solder ball, copper pillar, etc.) to couple the semiconductor device 300 to external circuits or devices. In the perspective view of the semiconductor device 300, the through-substrate vias, e.g., through-alumina vias (TAV) 355 (similar to vias 155 in FIG. 1) may be used to form a portion of the winding for each 3D inductor 310. As discussed in the foregoing, 3D inductors 310 may be formed using multiple winding portions (e.g., 311, 312 and 313). For example, a first portion of the windings 311 of the 3D inductor 310 may be formed in substrate 350 using through-substrate vias 355 (e.g., illustrated as a TAV 355 in the alumina substrate 350). A second portion of the windings 312 of the 3D inductor 310 may be formed by connections in at least one metal layer in the passive portion of that contains MIM capacitors 320. The second portion of the windings 312 of the 3D inductor 310 may be cross coupled to vias 355 to form an angled pattern (such as illustrated). A third portion of the windings 313 of the 3D inductor 310 may be formed by connections in at least one metal layer of on a side of the substrate 350 opposite the passive portion with the MIM capacitors 320. As illustrated, the third portion of the windings 313 of the 3D inductor 310 may be cross coupled to vias 355 in a generally straight fashion. However, it will be appreciated that the windings configurations for the 3D inductors 310 are not limited to a specific layout or configuration. Likewise, other capacitors, inductors or other circuit elements may be included in the semiconductor device 300 as will be appreciated by those skilled in the art. Accordingly, the foregoing illustrations and descriptions provided herein are solely to provide examples and are not intended to limit the various aspects disclosed herein. Further, some of the elements discussed in relation to the various aspects disclosed herein are not illustrated (e.g., 2D inductor, magnetic core, various metal and ILD layers, etc.) in the plan and perspective views of FIG. 3 to aid in reducing complication of the images.

Figure 4:
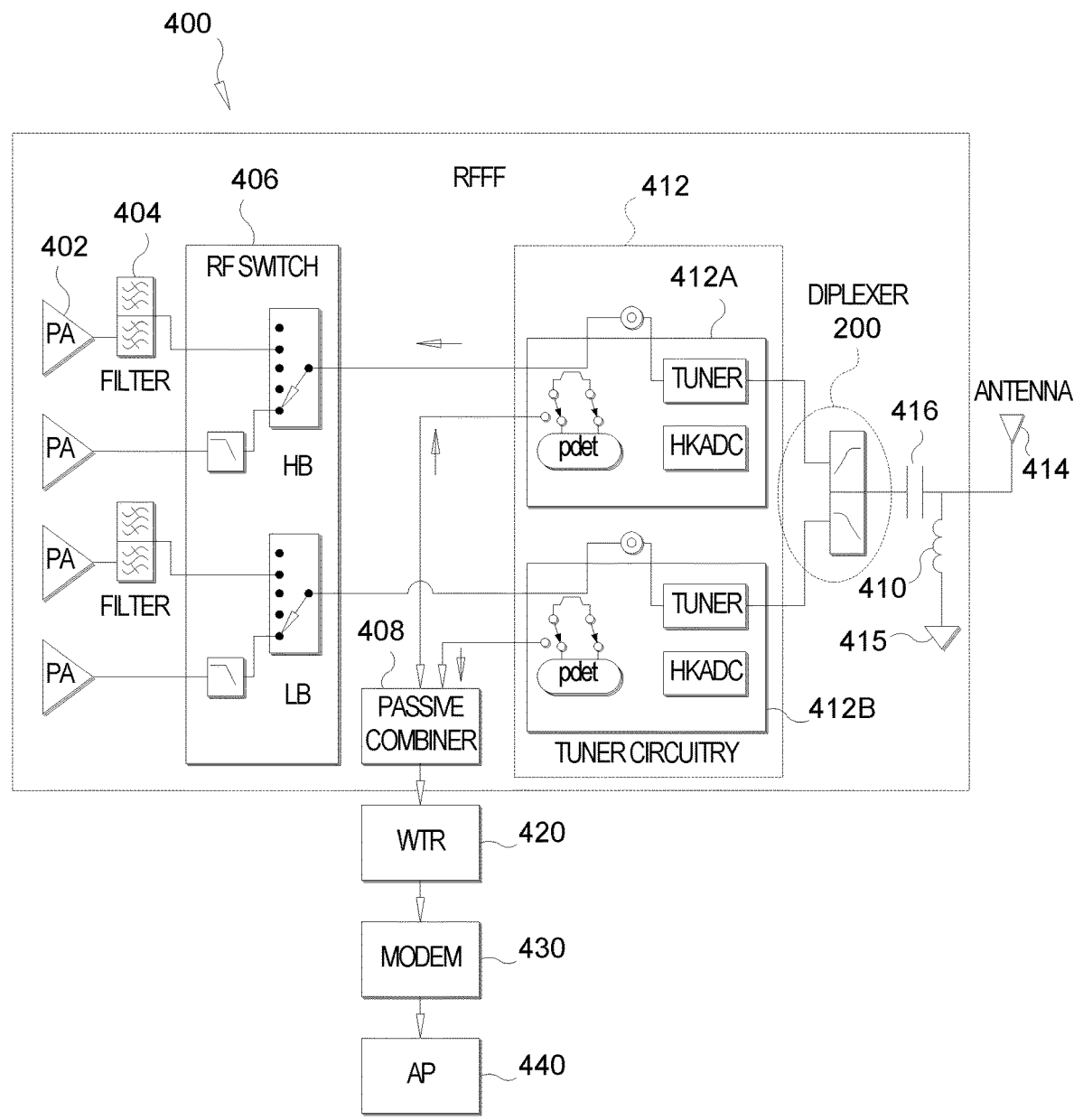
FIG. 4 illustrates a schematic diagram of a radio frequency (RF) front end (RFFE) module in accordance with some examples of the disclosure.

FIG. 4 illustrates a schematic diagram of a RF front end (RFFE) module 400 in accordance with some examples of the disclosure. As shown in FIG. 4, RFFE module 400 may include a diplexer 200 according to aspects of the disclosure. The RFFE 400 includes power amplifiers 402, duplexer/filters 404, and a radio frequency (RF) switch module 406. The power amplifiers 402 amplify signal(s) to a certain power level for transmission. The duplexer/filter 404 filters the input/output signals according to a variety of different parameters, including frequency, insertion loss, rejection or other like parameters. In addition, the RF switch module 406 may select certain portions of the input signals to pass on to the rest of the RF front end module 400.

The RF front end module 400 also includes tuner circuitry 412 (e.g., first tuner circuitry 412A and second tuner circuitry 412B), the diplexer 200, a capacitor 416, an inductor 418, a ground terminal 415 and an antenna 414. The tuner circuitry 412 (e.g., the first tuner circuitry 412A and the second tuner circuitry 412B) includes components such as a tuner, a portable data entry terminal (PDET), and a house keeping analog to digital converter (UKADC). The tuner circuitry 412 may perform impedance tuning (e.g., a voltage standing wave ratio (VSWR) optimization) for the antenna 414. The RF front end module 400 also includes a passive combiner 408 coupled to a wireless transceiver (WTR) 420. The passive combiner 408 combines the detected power from the first tuner circuitry 412A and the second tuner circuitry 412B. The wireless transceiver 420 processes the information from the passive combiner 108 and provides this information to a modem 430 (e.g., a mobile station modem (MSM)). The modem 430 provides a digital signal to an application processor (AP) 440.

As shown in FIG. 4, the diplexer 200 is between the tuner component of the tuner circuitry 412 and the capacitor 416, the inductor 418, and the antenna 414. The diplexer 200 may be placed between the antenna 414 and the tuner circuitry 412 to provide high system performance from the RF front end module 400 to a chipset including the wireless transceiver 420, the modem 430 and the application processor 440. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 416 and the inductor 418. The LC network which may provide extra impedance matching components for the antenna 414, when desired. Then a signal with the particular frequency is transmitted or received by the antenna 414. It will be appreciated that the various components illustrated may be separated multiple components or integrated into less components. Further, the various elements need not be included in RFFE modules according to various aspects disclosed herein, as determined by conventional design considerations and all variations are not attempted to be illustrated. Accordingly, the illustrations and descriptions provided herein are solely to provide examples and are not intended to limit the various aspects disclosed herein.

Figure 5A:
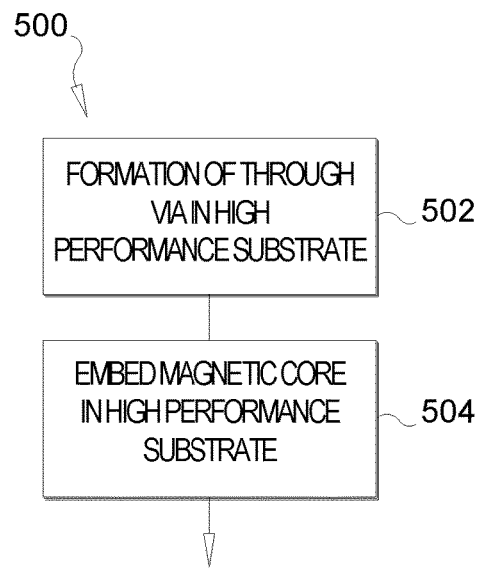
FIGS. 5A-F illustrate further example portions of a fabrication process of a semiconductor device in accordance with some examples of the disclosure.

FIG. 5A illustrates a portion of a fabrication process of a semiconductor device in accordance with some examples of the disclosure. As shown in FIG. 5A, there are some basic processes related to the substrate fabrication. At 502, a substrate (e.g., 150, 350) is provided and vias (e.g., TAV 155, 355) are formed in the substrate. The substrate may be an alumina ceramic substrate including a polished smoothing film (discussed below). The through-substrate vias (e.g., formed through the alumina substrate and may also be referred herein as through alumina via or TAV. The TAV may be formed by laser drilling (e.g., laser ablation), plasma etching (dry etch) or photo induced etching (wet etch) or other methods. The TAV may be filled with copper, gold or other suitable conductive materials. Filling the TAV with conductive material may be performed by sputtering, plating or any other known technique. TAVs allow for the electrical coupling through the alumina and according to aspects disclosed herein are also used for forming a portion of the windings of 3D inductors. In 504, a magnetic core is embedded in the substrate. For example, a cavity is formed in the substrate. The cavity can be formed by an etching substrate to form the cavity or any other suitable technique. The magnetic core can then be inserted in the substrate, a ceramic fill/paste can be used to secure the magnetic core. The substrate can be planarized/polished before and/or after the embedding of the magnetic core to provide that the substrate has a planar surface.

As part of fabricating the substrate, it will be appreciated that without adequate planarity, fabricating TAVs, etc. would not be practical and for some substrates that have rough surfaces. Accordingly, additional fabrication processes may be performed. For example, the alumina ceramic substrate may have a smoothing film deposited. The smoothing film can be selected from amorphous thermally-conductive electrically insulative films, such as discussed herein. For example, the depositing may be performed by a room-temperature physical vapor deposition process (RT-PVD) for depositing an alumina nitride (AlN) film. Alternatively, depositing may be performed by low temperature chemical vapor deposition (CVD) for depositing a diamond film or a silicon-carbide film. After the film is deposited, a polishing operation may be performed on the smoothing film to form a planar substrate-film surface on the alumina substrate. The polishing can be performed by a variety of methods depending on the film material, fabrication preferences, etc. For example, the smoothing film may be mechanically polished or may be polished by performing a chemical mechanical polish (CMP) process. The following figures provide some example processing techniques, merely for illustration, and are not intended to limit the various aspects herein.

Figure 5B:
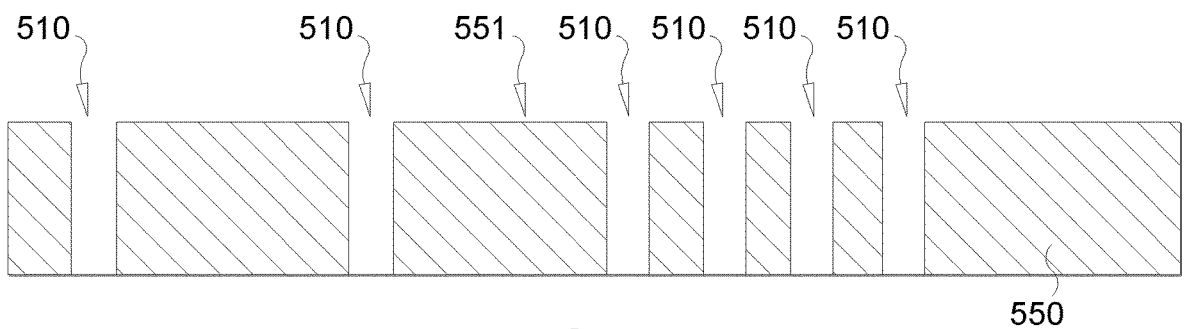

FIG. 5B illustrates a further example portion of a fabrication process of a semiconductor device in accordance with some examples of the disclosure. As shown in FIG. 5B, the substrate 550 (illustrated and discussed hereafter as alumina ceramic substrate 550) has the smoothing film (not explicitly illustrated) which has been processed to form a planar substrate surface 551. As discussed herein, the raw alumina ceramic substrate is processed to planarize the surface(s) (e.g., smoothing film and CMP, as discussed herein). At this point in the process, the surface 551 is sufficiently planarized to allow for further processing, As illustrated, substrate via openings 510 are formed through the alumina substrate 550. The substrate via openings 510 may be formed by laser drilling (e.g., laser ablation), plasma etching (dry etch) or photo induced etching (wet etch) or other methods. It will be appreciated that the illustrated processes of FIG. 5B are provided solely as an example illustration and is not intended to limit the various aspects disclosed herein.

Figure 5C:
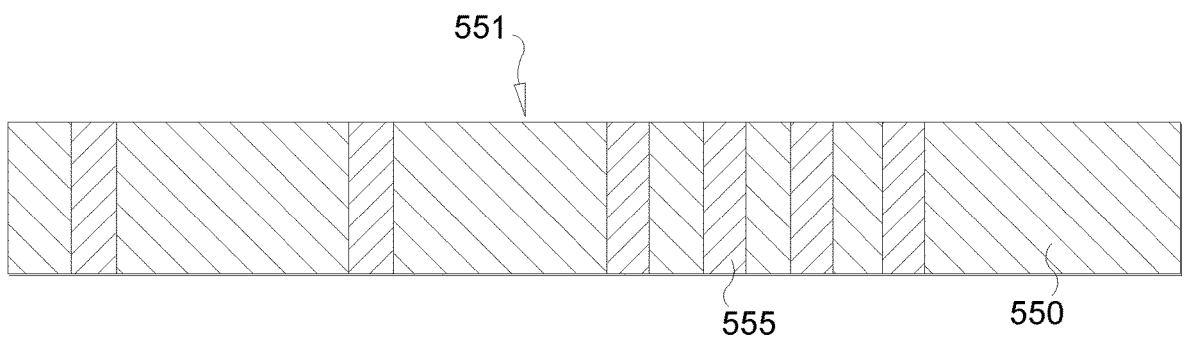

FIG. 5C illustrates a further example portion of a fabrication process of a semiconductor device in accordance with some examples of the disclosure. As shown in FIG. 5C, the alumina ceramic substrate 550 has the substrate via openings 510 (not illustrated) filled to form through-substrate vias 555, illustrated as TAVs 555. The TAVs 555 may be filled with copper, gold or other suitable conductive materials. Filling the TAV 555 with conductive material may be performed by sputtering, plating or any other known technique. TAVs allow for the electrical coupling through the alumina and according to aspects disclosed herein are also used for forming a portion of the windings of 3D inductors. It will be appreciated that the illustrated processes of FIG. 5C are provided solely as an example illustration and is not intended to limit the various aspects disclosed herein.

Figure 5D:
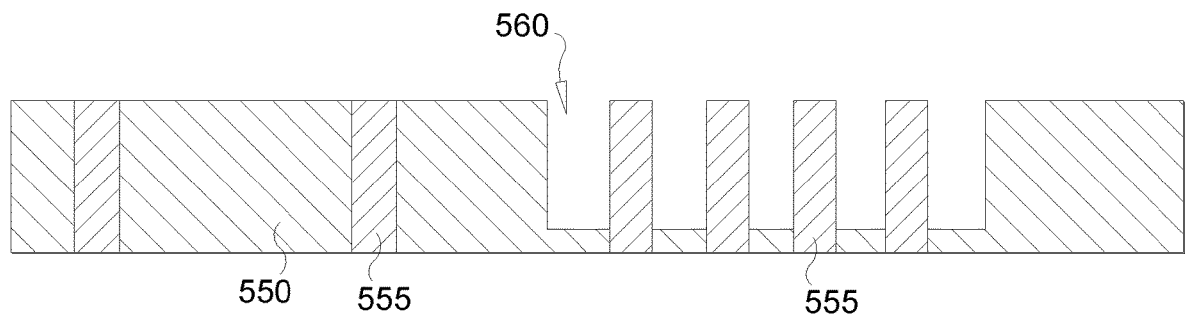

FIG. 5D illustrates a further example portion of a fabrication process of a semiconductor device in accordance with some examples of the disclosure. As shown in FIG. 5D, the alumina ceramic substrate 550 has the TAVs 555 formed. The processing continues with the formation of a cavity 560 in the alumina ceramic substrate 550. The cavity 560 can be formed by an etching the alumina ceramic substrate 550 to form the cavity 560 or any other suitable technique. It will be appreciated that the illustrated processes of FIG. 5D are provided solely as an example illustration and is not intended to limit the various aspects disclosed herein.

Figure 5E:
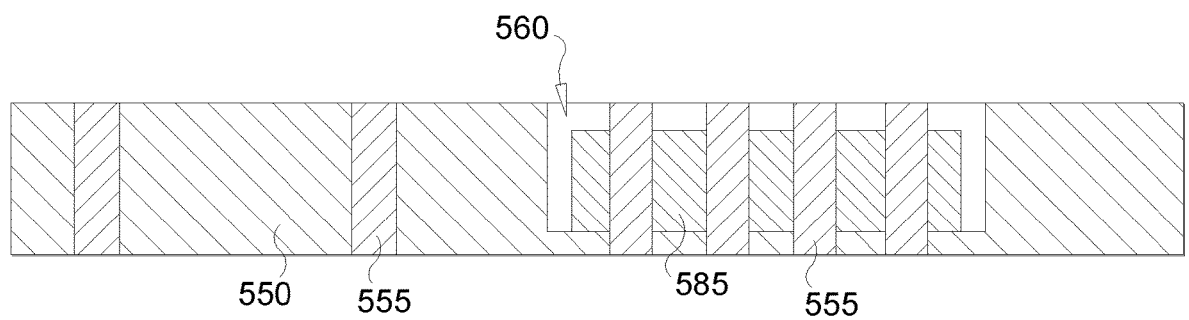

FIG. 5E illustrates a further example portion of a fabrication process of a semiconductor device in accordance with some examples of the disclosure. As shown in FIG. 5E, the alumina ceramic substrate 550 has the TAVs 555 and cavity 560 formed. The processing continues with the embedding of a magnetic core 585 in the cavity 560 in the alumina ceramic substrate 550. The magnetic core may be formed from high magnetic permeability (high μ) metals such as at least one of iron (Fe), cobalt (Co) or nickel (Ni) and/or other ferrite materials. It will be appreciated that the illustrated processes of FIG. 5E are provided solely as an example illustration and is not intended to limit the various aspects disclosed herein.

Figure 5F:
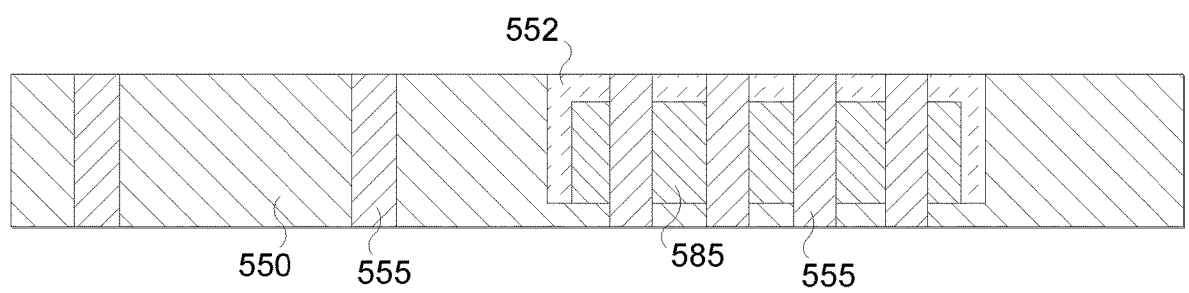

FIG. 5F illustrates a further example portion of a fabrication process of a semiconductor device in accordance with some examples of the disclosure. As shown in FIG. 5F, the alumina ceramic substrate 550 has the TAVs 555 and the magnetic core 585 embedded within. The processing continues with a core filler 552 used to secure the magnetic core 585 embedded in the alumina ceramic substrate 550. The core filler 552 may be glass or ceramic frit or paste. It will be appreciated that the illustrated processes of FIG. 5F are provided solely as an example illustration and is not intended to limit the various aspects disclosed herein.

Figure 6A:
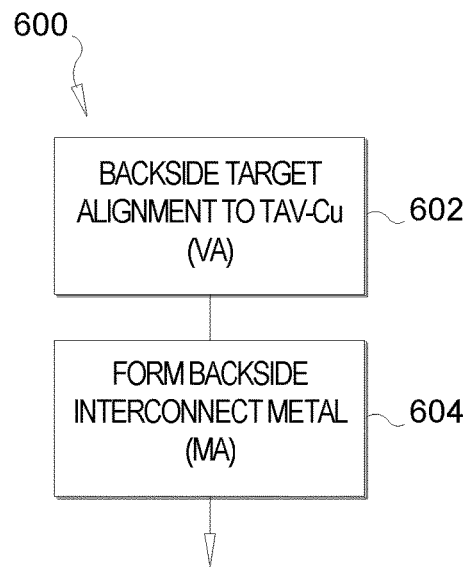
FIGS. 6A-C illustrate further example portions of a fabrication process of a semiconductor device in accordance with some examples of the disclosure.

FIG. 6A illustrates a further example portion of a fabrication process 600 of a semiconductor device in accordance with some examples of the disclosure. In block 602, the backside target alignment is performed to ensure the alignment of the TAV and the bottom layer (e.g., copper (Cu) layer, masks, etc.). In block 604, the fabrication process further includes forming backside interconnect metal (see, e.g., metal layer 140 (MA) in FIG. 1). The following figures provide some example processing techniques, merely for illustration, and are not intended to limit the various aspects herein.

Figure 6B:
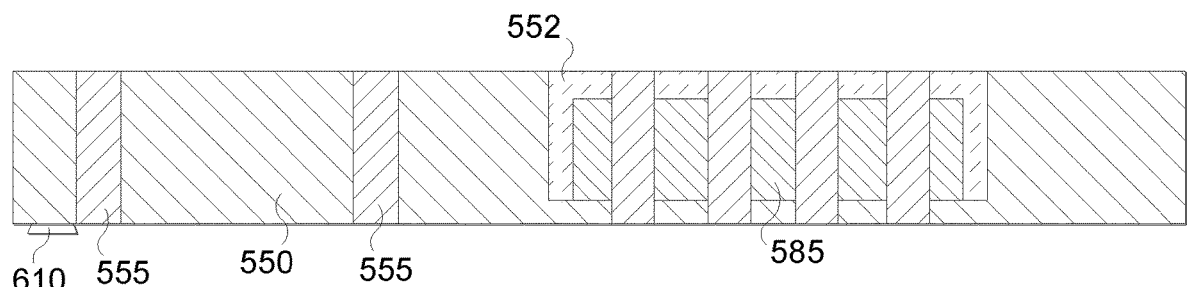

FIG. 6B illustrates a further example portion of a fabrication process of a semiconductor device in accordance with some examples of the disclosure, which continues from FIG. 5F. As shown in FIG. 6B, the alumina ceramic substrate 550 has the TAVs 555 and the magnetic core 585 embedded and secured by core filler 552. The processing continues with a backside target alignment to a target 610 being performed to ensure the alignment of the TAVs 555 and subsequent processing to form a bottom metal layer (e.g., depositing, patterning, etching, etc.). It will be appreciated that the illustrated processes of FIG. 6B are provided solely as an example illustration and is not intended to limit the various aspects disclosed herein.

Figure 6C:
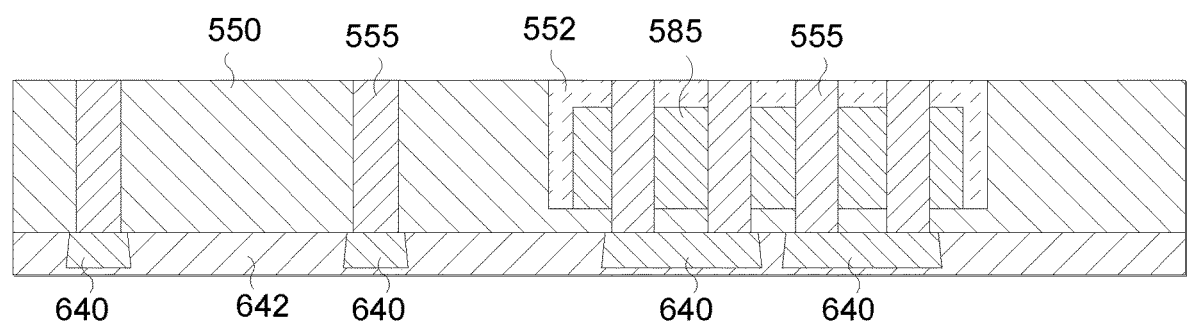

FIG. 6C illustrates a further example portion of a fabrication process of a semiconductor device in accordance with some examples of the disclosure. As shown in FIG. 6C, the alumina ceramic substrate 550 has the TAVs 555 and the magnetic core 585 embedded and secured by core filler 552. The processing continues with forming the bottom metal layer 640 (MA), may be formed on the alumina substrate 550 and enclosed in a bottom ILD 642 (ILD-A). As illustrated bottom the metal layer 640 can be deposited on the bottom surface of alumina ceramic substrate 550. Optionally, not expressly illustrated, a seed layer may be formed on the bottom surface of alumina ceramic substrate 550 to aid in the adhesion and formation of the bottom metal layer 640. The bottom metal layer 640 can be patterned and etched after being deposited on bottom the metal layer 640, to support the formation of various passive devices, active devices and/or interconnections. It will be appreciated that the illustrated processes of FIG. 6C are provided solely as an example illustration and is not intended to limit the various aspects disclosed herein.

Figure 7A:
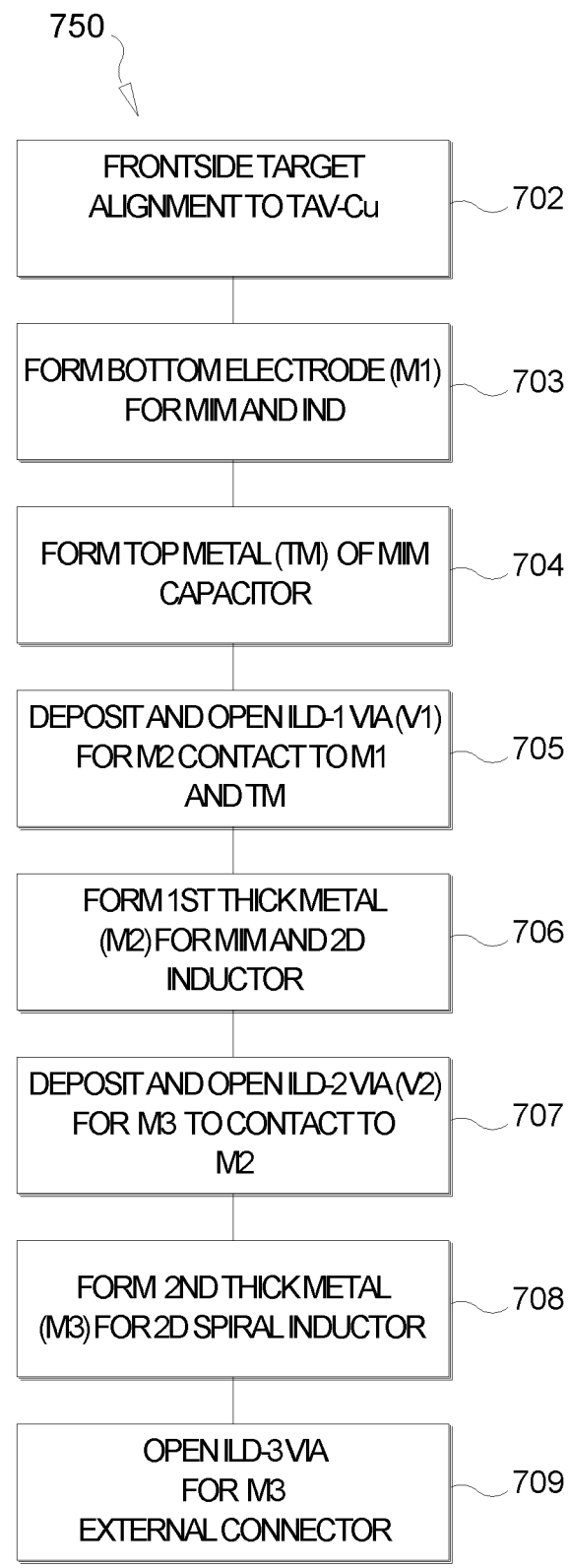
FIGS. 7A-K illustrate further example portions of a fabrication process of a semiconductor device in accordance with some examples of the disclosure.

FIG. 7A illustrates a further example portion of a fabrication process of a semiconductor device in accordance with some examples of the disclosure. The fabrication process 750 continues at 702 with forming topside target alignment to TAV-Cu to ensure proper alignment for the bottom electrode/M1 patterned elements. In 703, the bottom electrode (e.g., M1 110 in FIG. 1) can be formed for the MIM capacitors (e.g., 160, 320), inductors (e.g., 170, 180), etc. A PECVD process can be used to form the dielectrics of the MIM capacitors or an anodic oxide can be formed for the MIM capacitor. The fabrication process 750 continues at 704 with forming the top metal (e.g., TM 116) of the MIM capacitor. At 705, a first ILD (ILD-1) can be deposited on M1 using a spin coat and thermal cure of the ILD-1 polymer (e.g., PI or BCB). Further, in 705, the ILD-1 is opened (e.g., photomask and etched) to form a first set of vias (V1) for coupling a second metal layer (M2) to M1 and to TM of the MIM capacitor. The fabrication process 750 continues at 706 with forming the second metal layer (see, e.g., M2 120). The second metal layer M2 can be used for the MIM capacitor(s), 2D inductor(s) (e.g., 170) and/or 3D inductor(s) (e.g., 180, 310). The M2 layer may be a thick metal layer, as discussed herein. At 707, a second ILD (ILD-2) can be deposited on M2 via a spin coat and thermal cure of the ILD-2 polymer (e.g., PI or BCB). Further, at 707, the ILD-2 is opened to form vias (V2) for coupling a third metal layer (M3) to M2. The fabrication process 750 continues at 708 with forming the third metal layer (M3). The third metal layer M3 can be used for the 2D inductors and other connections and/or components. The third metal layer M3 layer in some aspects may also be a thick metal layer, as discussed herein. At 709, a third ILD (ILD-3) can be deposited on M3 via a spin coat and thermal cure of the ILD-3 polymer (e.g., PI or BCB). Further, at 709, the ILD-3 is opened to form vias for coupling the third metal layer (M3) to external connectors (e.g., ball, Cu pillar, CU bump, etc.) The external connectors (e.g., WLP ball 190, in FIG. 1) can be formed as a final portion of the fabrication process. It will be appreciated from the foregoing that many of the fabrication processes are conventional processes known in the art. Accordingly, it will be appreciated from the foregoing disclosure that additional and/or alternate processes for fabricating the various aspects disclosed herein will be apparent to those skilled in the art and a literal rendition of all the potential variations in the processes discussed above will not be provided or illustrated in the included drawings. However, to aid in the disclosure of the various aspects disclosed, the following figures provide some example processing techniques, merely for illustration, and are not intended to limit the various aspects herein.

Figure 7B:
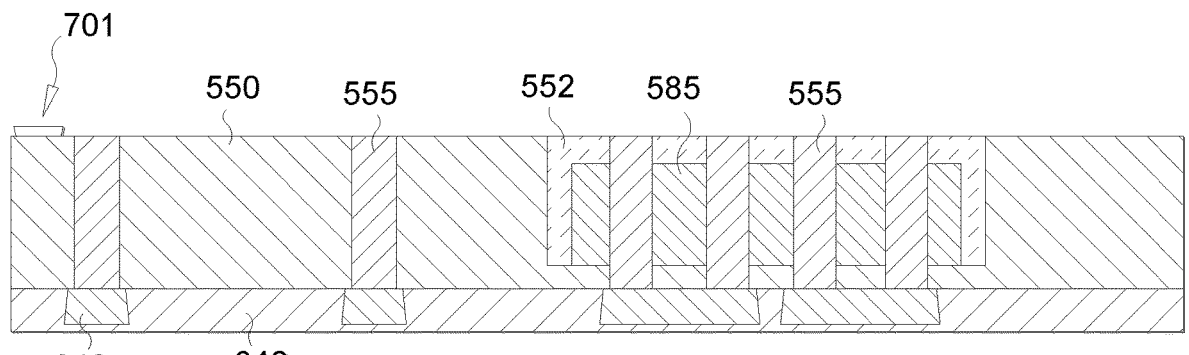

FIG. 7B illustrates a further example portion of a fabrication process of a semiconductor device in accordance with some examples of the disclosure, which follows from FIG. 6C. As shown in FIG. 7B, the alumina ceramic substrate 550 has the TAVs 555 and the magnetic core 585 embedded and secured by core filler 552. The bottom metal layer 640 (MA) is formed on the alumina substrate 550 and enclosed in bottom ILD 642. As illustrated, the processing continues with a topside target alignment to a target 701 being performed to ensure the alignment of the TAVs 555 and subsequent masks for forming the various top metal layers. It will be appreciated that the illustrated processes of FIG. 7B are provided solely as an example illustration and is not intended to limit the various aspects disclosed herein.

Figure 7C:
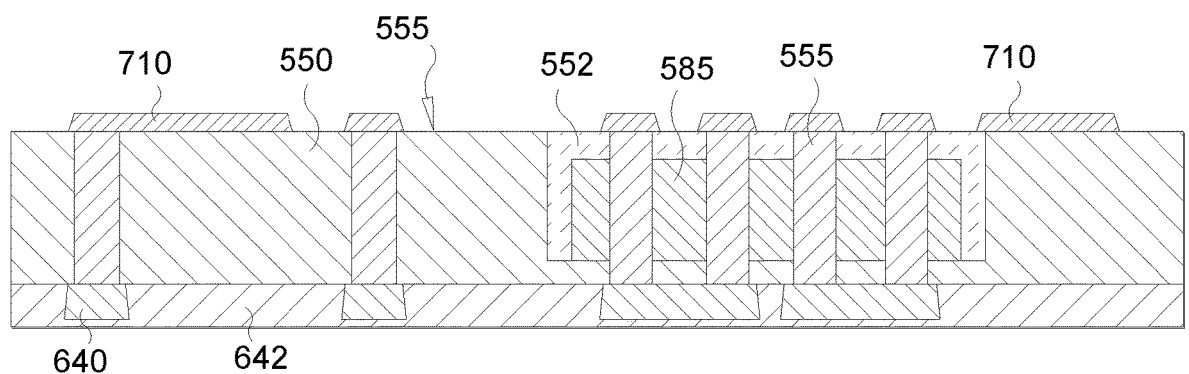

FIG. 7C illustrates a further example portion of a fabrication process of a semiconductor device in accordance with some examples of the disclosure. As shown in FIG. 7C, the alumina ceramic substrate 550 has the TAVs 555 and the magnetic core 585 embedded and secured by core filler 552. The bottom metal layer 640 (MA) is formed on the alumina substrate 550 and enclosed in bottom ILD 642. As illustrated, the processing continues with a first metal layer 710 (M1) being deposited on the top surface 555 of the alumina ceramic substrate 550. As mentioned above, and not expressly illustrated, a seed layer may be formed on the surface 555 to aid in the adhesion and formation of the first metal layer 710. The first metal layer 710 can be patterned and etched after being deposited on the surface 555, to support the formation of various passive devices, active devices and/or interconnections. It will be appreciated that the illustrated processes of FIG. 7C are provided solely as an example illustration and is not intended to limit the various aspects disclosed herein.

Figure 7D:
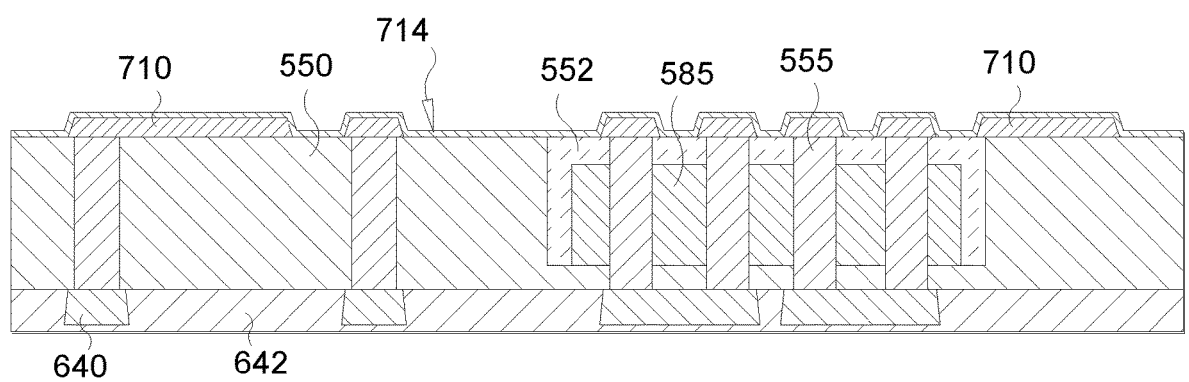

FIG. 7D illustrates a further example portion of a fabrication process of a semiconductor device in accordance with some examples of the disclosure. As shown in FIG. 7D, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) is formed on a top surface of the alumina substrate 550. As illustrated, the processing continues with a dielectric film 714 being deposited over the first metal layer 710 (M1) and also the alumina ceramic substrate 550 and core filler 552. The dielectric film 714 can be used in the formation of one or more MIM capacitors and/or other devices. In some aspects, the dielectric film 714 may only cover a portion of the first metal layer, such as in a portion where the MIM capacitor will be formed. It will be appreciated that the illustrated processes of FIG. 7C are provided solely as an example illustration and is not intended to limit the various aspects disclosed herein.

FIG. 7D illustrates a further example portion of a fabrication process of a semiconductor device in accordance with some examples of the disclosure. As shown in FIG. 7D, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) is formed on a top surface of the alumina substrate 550. As illustrated, the processing continues with a dielectric film 714 being deposited over the first metal layer 710 (M1) and also the alumina ceramic substrate 550 and core filler 552. The dielectric film 714 can be used to support the formation of one or more MIM capacitors and/or other devices. It will be appreciated that the illustrated processes of FIG. 7D are provided solely as an example illustration and is not intended to limit the various aspects disclosed herein.

Figure 7E:
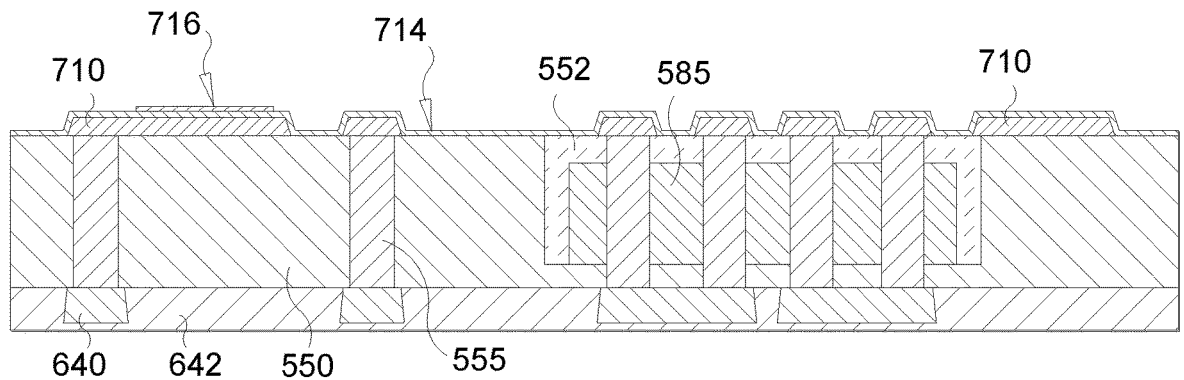

FIG. 7E illustrates a further example portion of a fabrication process of a semiconductor device in accordance with some examples of the disclosure. As shown in FIG. 7E, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been deposited, patterned and etched and dielectric film 714 applied. As illustrated, the processing continues with a top metal layer 716 being formed over a portion of the dielectric film 610 as part of the formation of a MIM capacitor. It will be appreciated that in alternative configurations, the top metal layer may not be used and the M2 layer may be used as the top electrode of a MIM capacitor. Accordingly, it will be appreciated that the illustrated processes of FIG. 7E are provided solely as an example illustration and is not intended to limit the various aspects disclosed herein.

Figure 7F:
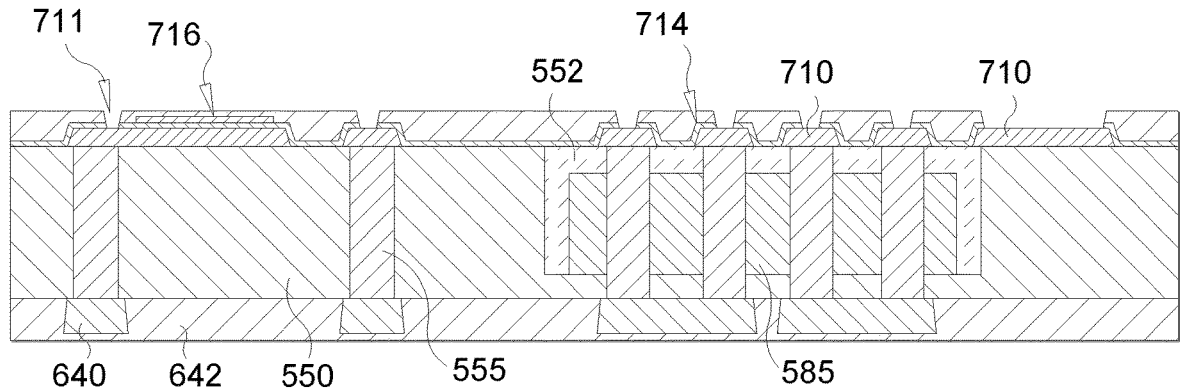

FIG. 7F illustrates a further example portion of a fabrication process of a semiconductor device in accordance with some examples of the disclosure. As shown in FIG. 7F, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion. To avoid recitation of all these aspects, the various elements formed to this point will be referred to as "the assembly". As illustrated, the processing continues with a first inter-layer dielectric (ILD) 712 being deposited over the assembly. The first ILD 712 may be formed of polyimide (PI), benzocyclobuten (BCB), polybenzoxazole (PBO), an acrylic, an epoxy, and/or other materials, as illustrative non-limiting examples. The first ILD 712 is patterned and etched to form openings 711 in the first ILD 712 to allow for connections to the various metal layers (e.g., M1 and 716) of the assembly covered by the first ILD 712. Additionally, the formation of the openings 711 also includes forming openings in the dielectric film 714 in some portions to allow access to the first metal layer 710. It will be appreciated that the illustrated configuration of FIG. 7F is provided solely as an example illustration and is not intended to limit the various aspects disclosed herein.

Figure 7G:
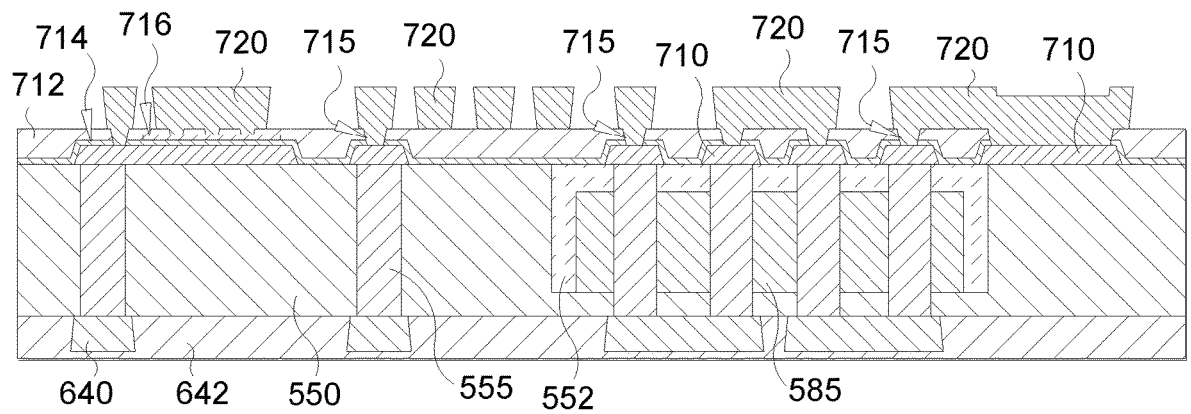

FIG. 7G illustrates a further example portion of a fabrication process of a semiconductor device in accordance with some examples of the disclosure. As shown in FIG. 7G, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion, with the assembly covered by first ILD 712. As illustrated, the processing continues with vias 715 being formed in the first ILD 712 to allow for connections to the various metal layers (e.g., M1 and 716) and the newly formed second metal layer 720 (M2). It will be appreciated that the vias 715 were formed in the openings 711 (not illustrated) and may be formed in a separate process or as part of the formation of the second metal layer 720 (M2). The second metal layer 720 can be patterned and etched, after being deposited on the first ILD 712, to support the formation of various passive devices, active devices and/or interconnections, as discussed herein. It will be appreciated that the illustrated configuration of FIG. 7G is provided solely as an example illustration and is not intended to limit the various aspects disclosed herein.

Figure 7H:
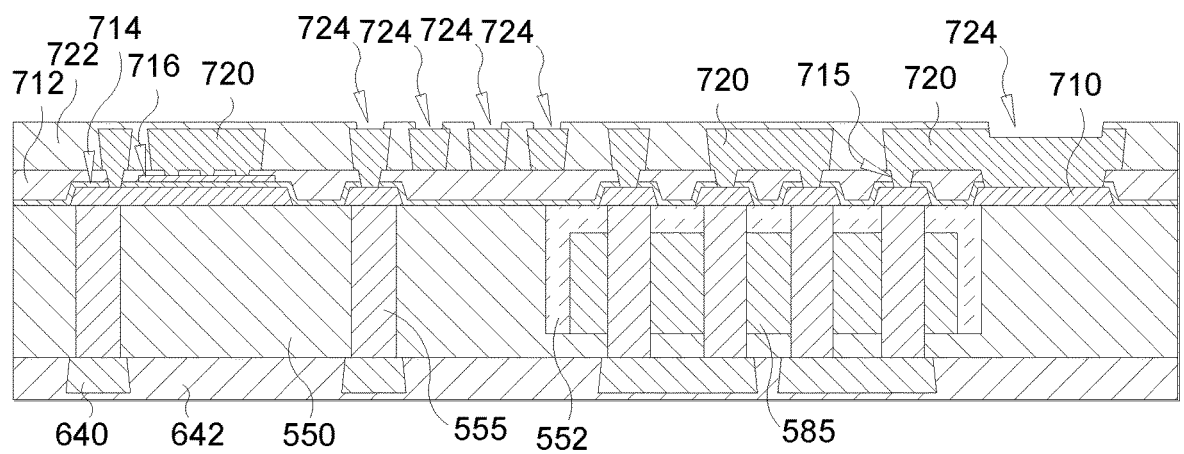

FIG. 7H illustrates a further example portion of a fabrication process of a semiconductor device in accordance with some examples of the disclosure. As shown in FIG. 7H, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion, with the assembly covered by first ILD 712 and the second metal layer 720 has been formed. As illustrated, the processing continues with a second ILD 722 being deposited over the first ILD 712 and second metal layer 720. The second ILD 722 may be formed of polyimide (PI), benzocyclobuten (BCB), polybenzoxazole (PBO), an acrylic, an epoxy, and/or other materials, as illustrative non-limiting examples. The second ILD 722 is also patterned and etched to form one or more openings 724, to allow access to one or more portions of the second metal layer 720. It will be appreciated that the illustrated configuration of FIG. 7H is provided solely as an example illustration and is not intended to limit the various aspects disclosed herein.

Figure 7I:
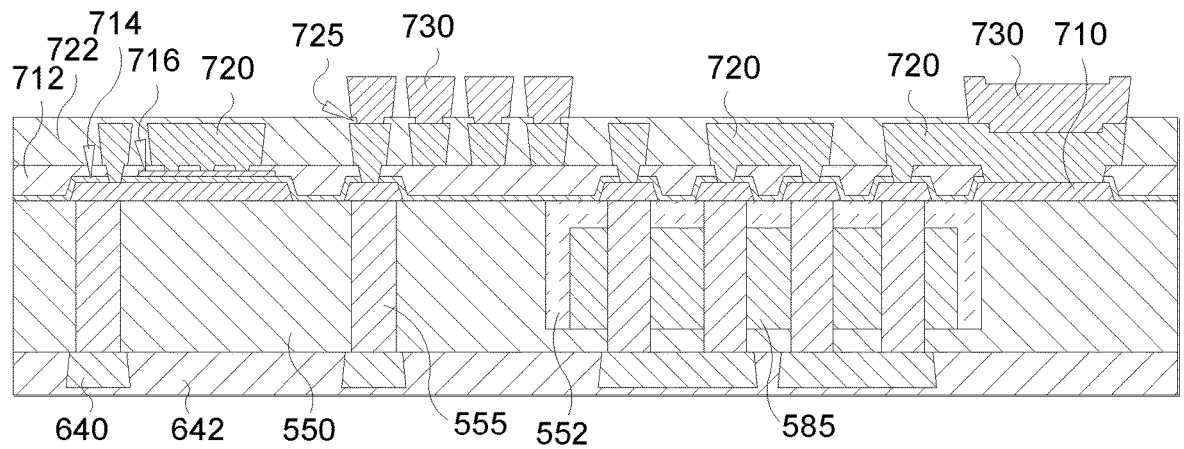

FIG. 7I illustrates a further example portion of a fabrication process of a semiconductor device in accordance with some examples of the disclosure. As shown in FIG. 7I, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion, with the assembly covered by first ILD 712, the second metal layer 720 has been formed and second ILD 722 applied. As illustrated, the processing continues with vias 725 being formed in the second ILD 722 to allow for connections to the various portions of the second metal layer 720 and the newly formed third metal layer 730 (M3). It will be appreciated that the vias 725 were formed in the openings 724 (not illustrated) and may be formed in a separate process or as part of the formation of the third metal layer 730 (M3). The third metal layer 730 can be patterned and etched, after being deposited on the second ILD 722, to support the formation of various passive devices, active devices and/or interconnections, as discussed herein. It will be appreciated that the illustrated configuration of FIG. 7I is provided solely as an example illustration and is not intended to limit the various aspects disclosed herein.

Figure 7J:
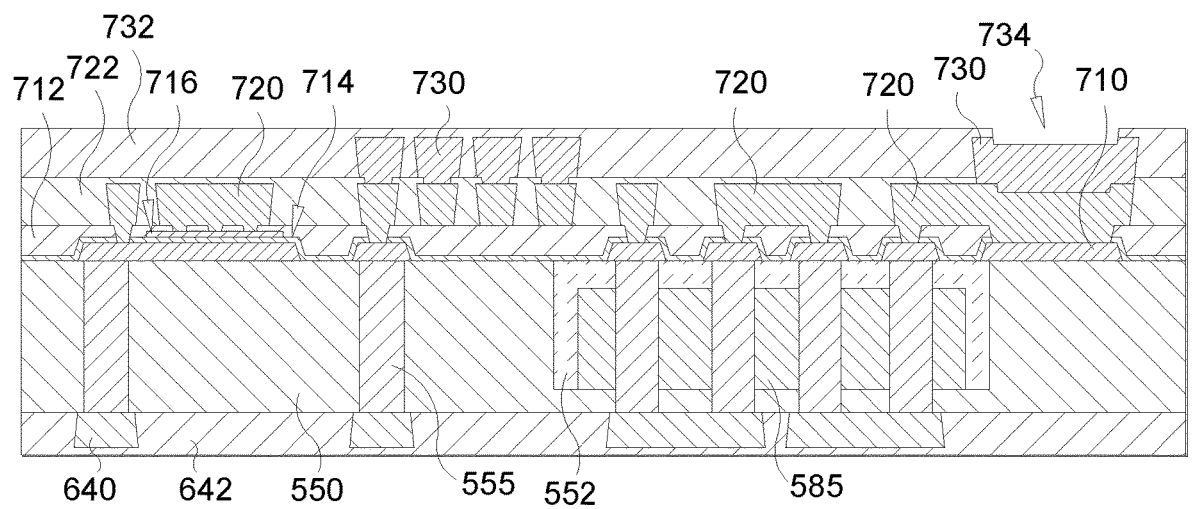

FIG. 7J illustrates a further example portion of a fabrication process of a semiconductor device in accordance with some examples of the disclosure. As shown in FIG. 7J, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion, with the assembly covered by first ILD 712. The second metal layer 720 has been formed, second ILD 722 applied and third metal layer 730 formed. As illustrated, the processing continues with a third ILD 732 being deposited over the second ILD 722 and third metal layer 730. The third ILD 732 may be formed of polyimide (PI), benzocyclobuten (BCB), polybenzoxazole (PBO), an acrylic, an epoxy, and/or other materials, as illustrative non-limiting examples. The third ILD 732 is also patterned and etched to form one or more openings 734, to allow access to one or more portions of the third metal layer 730. It will be appreciated that the illustrated configuration of FIG. 7J is provided solely as an example illustration and is not intended to limit the various aspects disclosed herein.

Figure 7K:
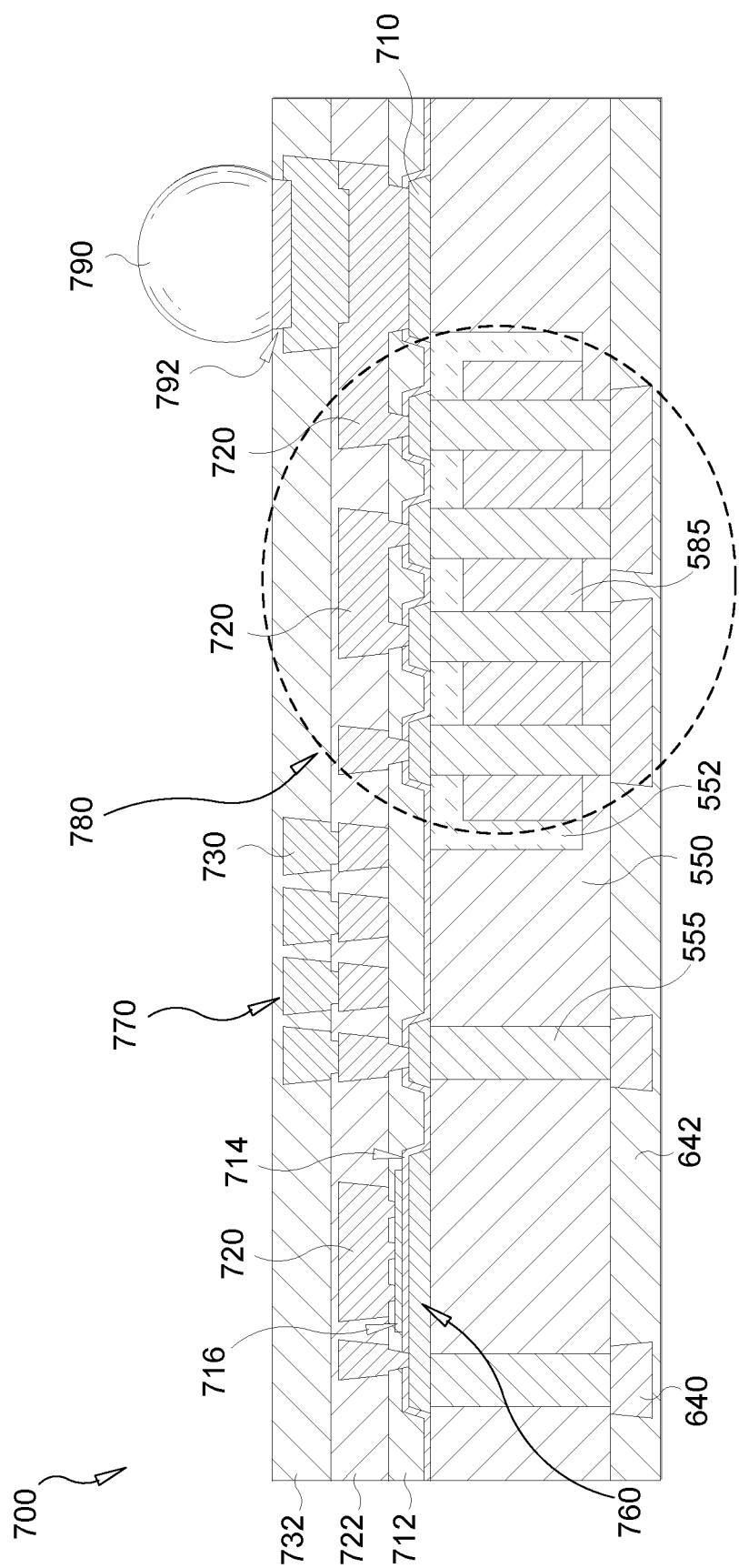

FIG. 7K illustrates a further example portion of a fabrication process of a semiconductor device 700 in accordance with some examples of the disclosure. As shown in FIG. 7K, the alumina ceramic substrate 550 has the TAVs 555 and the magnetic core 585 embedded and secured by core filler 552. The bottom metal layer 640 (MA) is formed on a bottom surface of the alumina substrate 550 and enclosed in bottom ILD 642. The first metal layer 710 (M1) has been formed and dielectric film 714 applied, with the top metal layer 716 over a portion, with the assembly covered by first ILD 712. The second metal layer 720 has been formed, second ILD 722 applied and third metal layer 730 is formed with the third ILD 732 applied. As illustrated, the processing continues with the third ILD 732 having one or more vias for coupling the third metal layer 730 (M3) to external connections. The via, as illustrated, may be formed as an under bump metal layer (UBM) 792 on which an external connector (e.g., probe; WLP ball, Cu pillar, CU bump, etc.) is formed. In the illustrated example, a WLP ball 790, can be formed as a final portion of the fabrication process. In the final configuration, the various components, such as MIM capacitor 760, 2D inductor 770 and 3D inductor may be formed from the various metal layers, vias, etc., as discussed herein. It will be appreciated that the illustrated configuration of FIG. 7K is provided solely as an example illustration and is not intended to limit the various aspects disclosed herein.

The various devices, processes and functionalities disclosed herein may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a semiconductor chip. The chips may then be employed in devices described above.

In order to fully illustrate aspects of the present disclosure, methods of fabrication are presented. Other methods of fabrication are possible, and discussed fabrication methods are presented only to aid understanding of the concepts disclosed herein.

Figure 8:
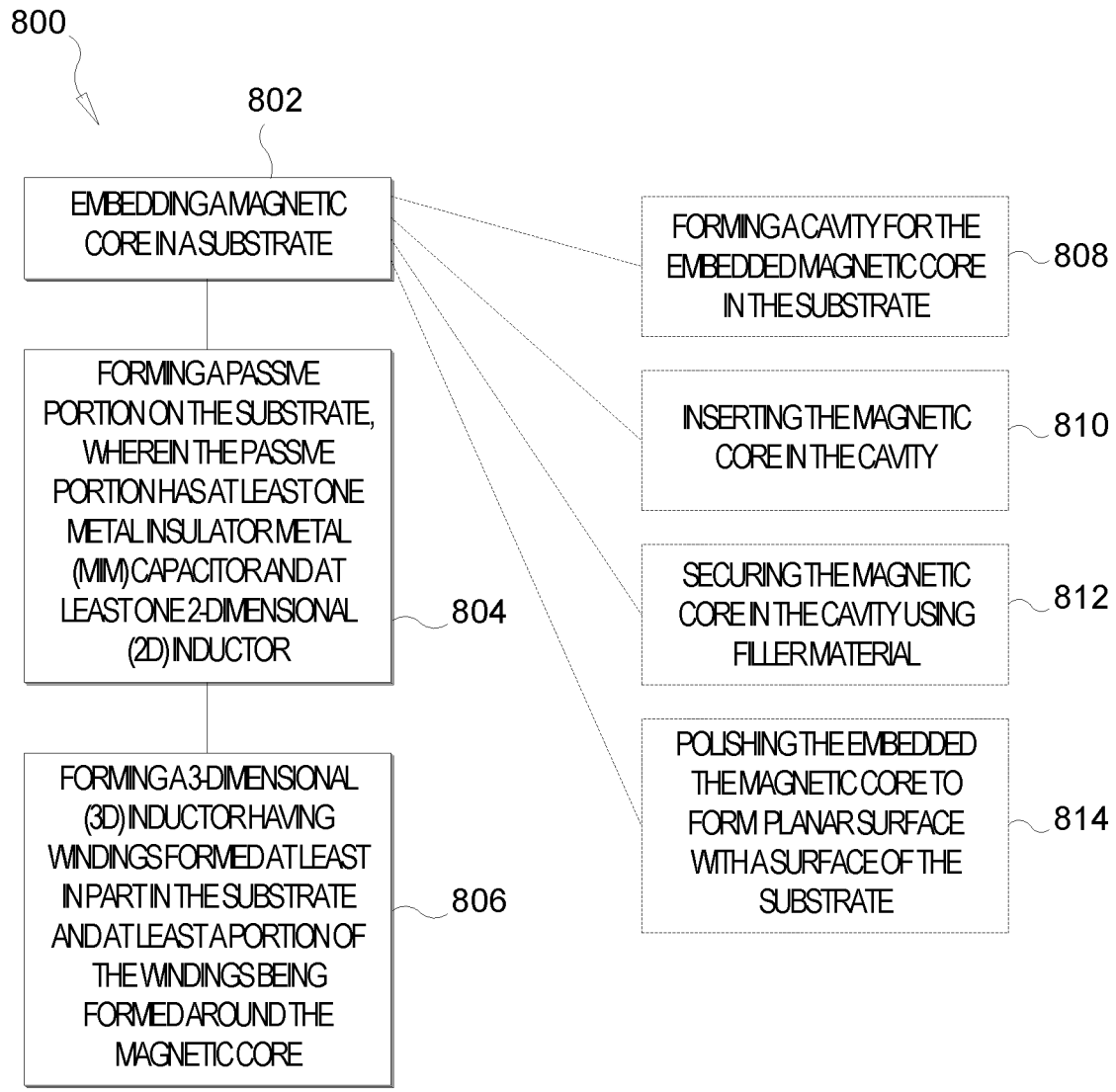
FIG. 8 illustrates a flowchart of a method for manufacturing a semiconductor device in accordance with some examples of the disclosure.

It will be appreciated from the foregoing that there are various methods for fabricating semiconductors including a 3D inductor with a magnetic core embedded in a substrate as disclosed herein. FIG. 8 illustrates a flowchart of a method for manufacturing a semiconductor device in accordance with some examples of the disclosure. As shown in FIG. 8, the partial method 800 may begin in block 802 with embedding a magnetic core in a substrate. The partial method 800 may continue in block 804 with forming a passive portion on the substrate, wherein the passive portion has at least one metal insulator metal (MIM) capacitor and at least one 2-dimensional (2D) inductor. The partial method 800 may continue in block 806 with forming a 3-dimensional (3D) inductor having windings formed at least in part in the substrate and at least a portion of the windings being formed around the magnetic core. Optional aspects can also be recognized from the foregoing disclosure. For example, optionally the method 800 in relation to embedding the magnetic core can continue, at block 808, with forming a cavity for the embedded magnetic core in the substrate. At block 810, the method 800 continues with inserting the magnetic core in the cavity. At block 812, the method 800 continues with securing the magnetic core in the cavity using filler material. At block 814, the method 800 continues with polishing the embedded the magnetic core to form a planar surface with a surface of the substrate. These and additional aspects are discussed in the foregoing disclosure. Accordingly, it will be appreciated from the foregoing disclosure that additional processes for fabricating the various aspects disclosed herein will be apparent to those skilled in the art and a literal rendition of the processes discussed above will not be provided or illustrated in the included drawings.

Figure 9:
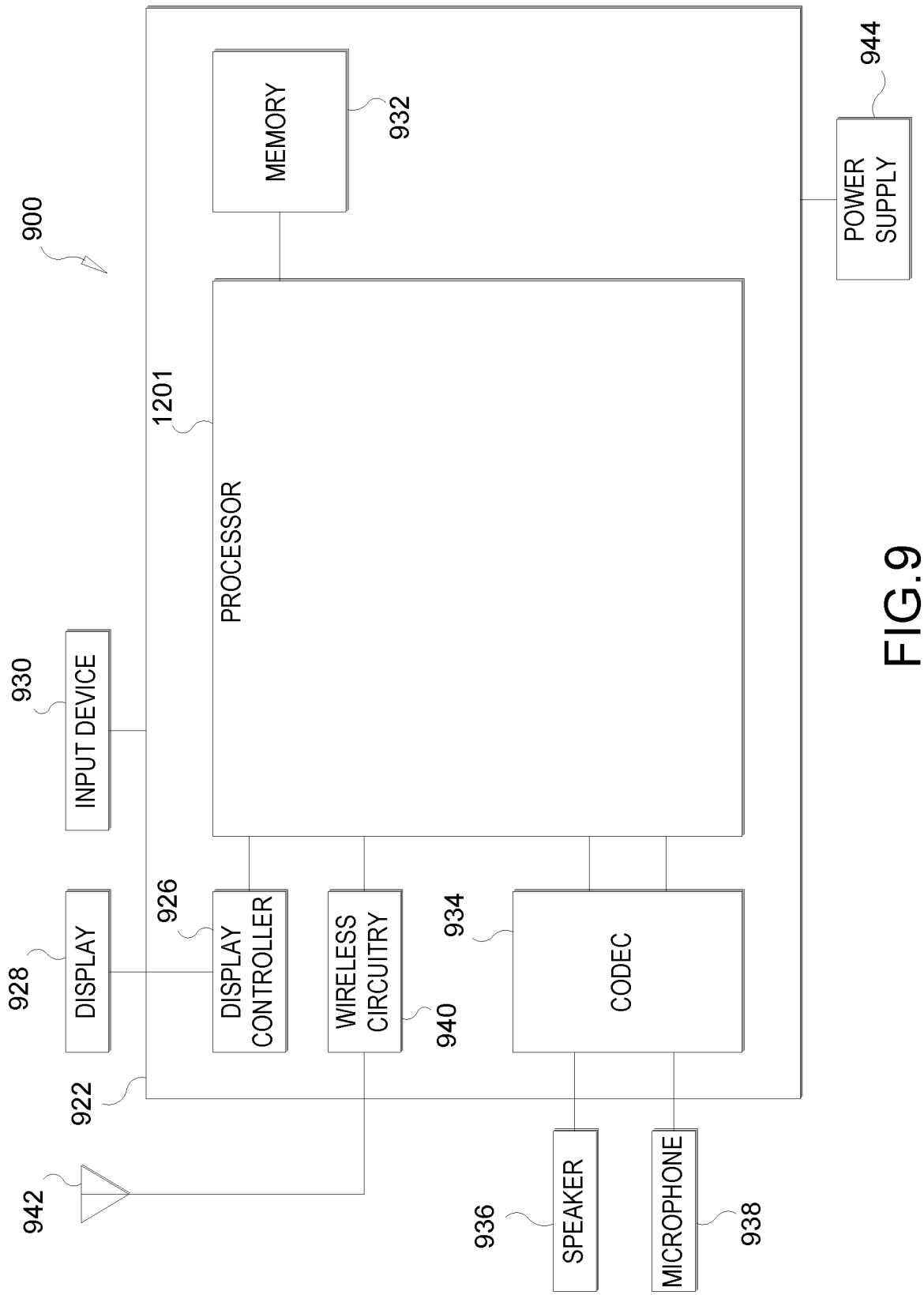
FIG. 9 illustrates a mobile device in accordance with some examples of the disclosure.

FIG. 9 illustrates a mobile device in accordance with some examples of the disclosure. Referring now to FIG. 9, a block diagram of a mobile device that is configured according to example aspects is depicted and generally designated mobile device 900. In some aspects, mobile device 900 may be configured as a wireless communication device. As shown, mobile device 900 includes processor 901. Processor 901 may be communicatively coupled to memory 932 over a link, which may be a die-to-die or chip-to-chip link. Mobile device 900 also includes display 928 and display controller 926, with display controller 926 coupled to processor 901 and to display 928.

In some aspects, FIG. 9 may include coder/decoder (CODEC) 934 (e.g., an audio and/or voice CODEC) coupled to processor 901; speaker 936 and microphone 938 coupled to CODEC 934; and wireless circuitry 940 (which may include a modem, RF circuitry, filters, etc., which may be implemented using one or more semiconductor devices with alumina substrates, 3D inductors and embedded magnetic cores, as disclosed herein) coupled to wireless antenna 942 and to processor 901.

In a particular aspect, where one or more of the above-mentioned blocks are present, processor 901, display controller 926, memory 932, CODEC 934, and wireless controller 940 can be included in a system-in-package or system-on-chip device 922. Input device 930 (e.g., physical or virtual keyboard), power supply 944 (e.g., battery), display 928, input device 930, speaker 936, microphone 938, wireless antenna 942, and power supply 944 may be external to system-on-chip device 922 and may be coupled to a component of system-on-chip device 922, such as an interface or a controller.

It should be noted that although FIG. 9 depicts a mobile device, processor 901 and memory 932 may also be integrated into a set top box, a music player, a video player, an entertainment unit, a navigation device, a personal digital assistant (PDA), a fixed location data unit, a computer, a laptop, a tablet, a communications device, a mobile phone, an Internet of things (IoT) device or other similar devices.

Figure 10:
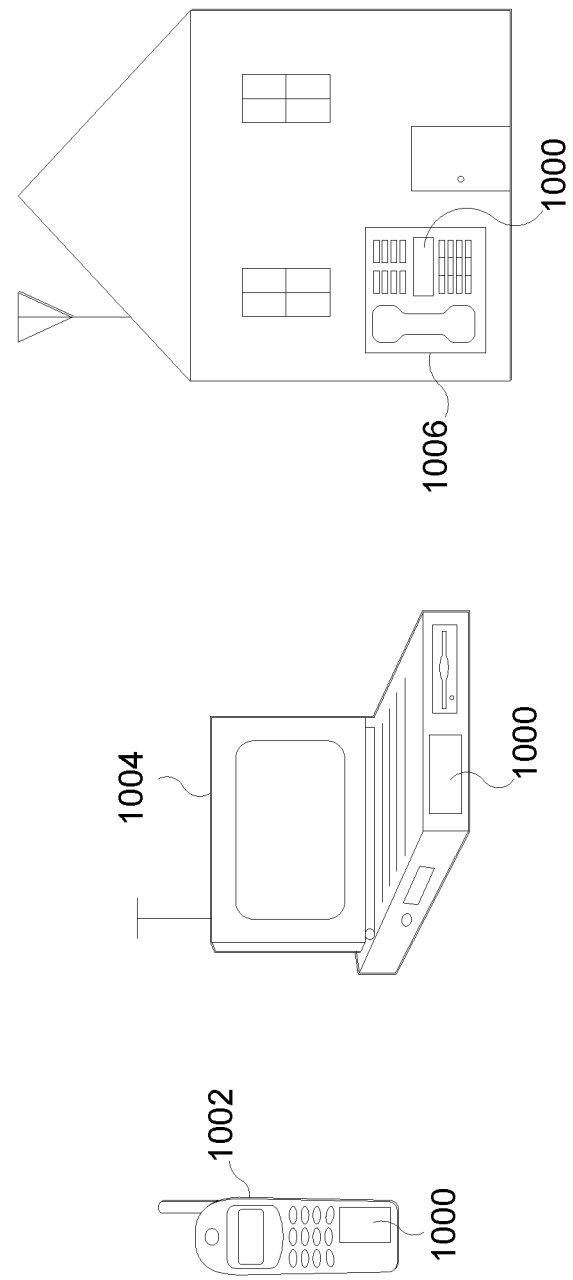
FIG. 10 illustrates various electronic devices that may be integrated with any of the aforementioned devices in accordance with various examples of the disclosure.

FIG. 10 illustrates various electronic devices that may be integrated with any of the aforementioned integrated device or semiconductor device accordance with various examples of the disclosure. For example, a mobile phone device 1002, a laptop computer device 1004, and a fixed location terminal device 1006 may each be consider generally user equipment (UE) and may include a semiconductor device 1000 as described herein. The semiconductor device 1000 may be, for example, any of the integrated circuits, dies, integrated devices, integrated device packages, integrated circuit devices, device packages, integrated circuit (IC) packages, package-on-package devices described herein. The devices 1002, 1004, 1006 illustrated in FIG. 10 are merely an example. Other electronic devices may also feature the semiconductor device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-10 may be rearranged and/or combined into a single component, process, feature or function or incorporated in several components, processes, or functions. Additional elements, components, processes, and/or functions may also be added without departing from the disclosure. It should also be noted that FIGS. 1-10 and corresponding description in the present disclosure are not limited to dies and/or ICs. In some implementations, FIGS. 1-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in each claim. Rather, the various aspects of the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted a dependent claim can refer in the claims to a specific combination with one of the other claims. Further, other examples can also encompass or include a combination of one or more dependent claims with the subject matter of any other dependent claim or a combination of any feature with other dependent and independent claims. Such combinations are proposed herein, unless it is explicitly expressed or can be readily inferred that a specific combination is not intended (e.g., contradictory aspects, such as defining a feature as both an insulator and a conductor). Furthermore, it is also intended that features of a claim can be included in any other independent claim, even if said claim is not directly dependent on the independent claim.

In accordance with the various aspects disclosed herein, at least one aspect includes a device (e.g., semiconductor device (e.g., 100, 200, 300, 400, 700, etc., alone or integrated into another device) including: a passive portion (e.g., 105) having at least one metal insulator metal (MIM) capacitor (160, 320, 760) and at least one 2-dimensional (2D) inductor (170, 770). The device also includes a substrate (150, 350, 550), where the passive portion (105) is formed on the substrate (150, 350, 550). The device also includes a magnetic core (185, 585) embedded in the substrate (150, 350, 550). The device also includes a 3-dimensional (3D) inductor (180, 310, 780) having windings (181, 182, 183, 311, 312, 313) formed at least in part in the substrate (150, 350, 550) and at least a portion of the windings (181, 182, 183, 311, 312, 313) being formed around the magnetic core (185, 585). It will be appreciated from the disclosure herein that the various technical advantages are provided by the various aspects disclosed. In at least some aspects, the 3D inductor having at least a portion of the windings enclosing the embedded magnetic core allows for a better Q-Factor for the inductor and better RF performance due to the increased permeability of the magnetic core in comparison to a conventional substrate. Further, the 3D inductor windings are in both the substrate and passive portion, which allows for a thinner structure of the semiconductor device than conventional designs.

Other technical advantages will be recognized from various aspects disclosed herein and these technical advantages are merely provided as examples and should not be construed to limit any of the various aspects disclosed herein.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device comprising:
   a passive portion having at least one metal insulator metal (MIM) capacitor and at least one 2-dimensional (2D) inductor;
   a substrate, wherein the passive portion is formed on the substrate;
   a magnetic core embedded in the substrate; and
   a 3-dimensional (3D) inductor having windings formed at least in part in the substrate and at least a portion of the windings being formed around the magnetic core, wherein the passive portion has multiple metal layers, the at least one 2D inductor is formed on adjacent metal layers of the multiple metal layers, and at least another portion of the windings of the 3D inductor is formed on at least one common metal layer with the at least one 2D inductor.

2. The device of claim 1, wherein the substrate is an alumina ceramic substrate.

3. The device of claim 1, wherein the substrate is formed of a material with a low loss tangent, high thermal conductivity and moderate coefficient of thermal expansion (CTE).

4. The device of claim 1, wherein a first portion of the windings of the 3D inductor are formed in substrate using through-substrate vias.

5. The device of claim 4, wherein a second portion of the windings of the 3D inductor are formed by connections in at least one metal layer in the passive portion.

6. The device of claim 5, wherein a third portion of the windings of the 3D inductor are formed by connections in at least one metal layer of on a side of the substrate opposite the passive portion.

7. The device of claim 1, wherein the magnetic core extends beyond the windings of the 3D inductor.

8. The device of claim 1, wherein the at least one MIM capacitor is formed from adjacent metal layers of the multiple metal layers.

9. The device of claim 8, wherein the at least a portion of the windings of the 3D inductor is formed on at least one common metal layer with the MIM capacitor.

10. The device of claim 1, further comprising:
a cavity in the substrate, wherein the magnetic core is embedded in the cavity.

11. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

12. The device of claim 1, wherein the adjacent metal layers are thick metal layers.

13. The device of claim 1, wherein the adjacent metal layers are on an order of 8 um to 16 um in thickness.

14. The device of claim 1, wherein the device is a radio frequency front end (RFFE).

15. The device of claim 1, wherein the magnetic core is at least one of iron (Fe), cobalt (Co) or nickel (Ni).

16. The device of claim 1, wherein the device is an integrated passive device.

17. The device of claim 1, wherein the device is a multiplexer.

18. The device of claim 1, wherein the device is a diplexer.

19. A device comprising:
a passive portion having at least one metal insulator metal (MIM) capacitor and at least one 2-dimensional (2D) inductor;
a substrate, wherein the passive portion is formed on the substrate;
a magnetic core embedded in the substrate; and
a 3-dimensional (3D) inductor having windings formed at least in part in the substrate and at least a portion of the windings being formed around the magnetic core, wherein the magnetic core extends beyond the windings of the 3D inductor.

20. A method for manufacturing a device, the method comprising:
embedding a magnetic core in a substrate;
forming a passive portion on the substrate, wherein the passive portion has at least one metal insulator metal (MIM) capacitor and at least one 2-dimensional (2D) inductor; and
forming a 3-dimensional (3D) inductor having windings formed at least in part in the substrate and at least a portion of the windings being formed around the magnetic core, wherein embedding the magnetic core further comprises:
forming a cavity for the embedded magnetic core in the substrate;
inserting the magnetic core in the cavity; and
securing the magnetic core in the cavity using filler material.

21. The method of claim 20, wherein the passive portion has multiple metal layers, the at least one 2D inductor is formed on adjacent metal layers of the multiple metal layers, and at least another portion of the windings of the 3D inductor is formed on at least one common metal layer with the at least one 2D inductor.

22. The method of claim 20, wherein the substrate is an alumina ceramic substrate.

23. The method of claim 20, wherein the substrate is formed of a material with a low loss tangent, high thermal conductivity and moderate coefficient of thermal expansion (CTE).

24. The method of claim 20, further comprising:
forming through-substrate vias in the substrate, wherein the substrate is alumina ceramic substrate and the through-substrate vias are through alumina vias.

25. The method of claim 20, wherein a first portion of the windings of the 3D inductor are formed in substrate using through-substrate vias, and wherein a second portion of the windings of the 3D inductor are formed by connections in at least one metal layer in the passive portion.

26. The method of claim 25, wherein a third portion of the windings of the 3D inductor are formed by connections in at least one metal layer of on a side of the substrate opposite the passive portion.

27. The method of claim 20, wherein the device is an integrated passive device.

28. The method of claim 20, wherein the magnetic core extends beyond the windings of the 3D inductor.

29. The method of claim 20, wherein the magnetic core is at least one of iron (Fe), cobalt (Co) or nickel (Ni).

* * * * *